(12) United States Patent
Yu et al.

(10) Patent No.: US 8,706,062 B1
(45) Date of Patent: Apr. 22, 2014

(54) SELF-ADAPTIVE POWER AMPLIFICATION

(75) Inventors: Qian Yu, Sunnyvale, CA (US); Abhijit G Shanbhag, Sunnyvale, CA (US); Yan Wang, Sunnyvale, CA (US)

(73) Assignee: Scintera Networks, Inc., Sunnyvale, CA (US)

( * ) Notice: Subject to any disclaimer, the term of this patent is extended or adjusted under 35 U.S.C. 154(b) by 486 days.

(21) Appl. No.: 12/421,324

(22) Filed: Apr. 9, 2009

Related U.S. Application Data

(60) Provisional application No. 61/139,524, filed on Dec. 19, 2008.

(51) Int. Cl.
*H01Q 11/12* (2006.01)

(52) U.S. Cl.
USPC ........................ 455/127.1; 455/126

(58) Field of Classification Search
USPC .............. 455/114.2, 114.3, 126, 127.1, 127.2
See application file for complete search history.

(56) References Cited

U.S. PATENT DOCUMENTS

| | | | |
|---|---|---|---|
| 5,475,707 A | | 12/1995 | Ficarra et al. |
| 5,524,281 A | | 6/1996 | Bradley et al. |
| 5,870,668 A | * | 2/1999 | Takano et al. .................. 455/126 |
| 5,877,653 A | * | 3/1999 | Kim et al. ...................... 330/149 |
| 6,069,527 A | * | 5/2000 | Maruyama ...................... 330/51 |
| 6,075,411 A | * | 6/2000 | Briffa et al. .................... 330/149 |
| 6,133,789 A | * | 10/2000 | Braithwaite .................. 330/149 |
| 6,138,042 A | * | 10/2000 | Midya et al. ................... 455/571 |
| 6,141,541 A | * | 10/2000 | Midya et al. ..................... 455/91 |
| 6,188,253 B1 | | 2/2001 | Gage et al. |
| 6,211,733 B1 | | 4/2001 | Gentzler |
| 6,236,837 B1 | * | 5/2001 | Midya .......................... 455/63.1 |
| 6,275,106 B1 | * | 8/2001 | Gomez ......................... 330/151 |
| 6,275,685 B1 | | 8/2001 | Wessel et al. |
| 6,429,736 B1 | | 8/2002 | Parry et al. |
| 6,531,957 B1 | | 3/2003 | Nysen |
| 6,600,792 B2 | * | 7/2003 | Antonio et al. ............... 375/297 |
| 6,603,806 B2 | | 8/2003 | Martone |
| 6,674,324 B1 | * | 1/2004 | Ocenasek et al. ............... 330/52 |
| 6,710,652 B2 | * | 3/2004 | Miyaji et al. .................. 330/151 |

(Continued)

OTHER PUBLICATIONS

I. Kim et al., "Predistortion Power Amplifier for Base-Station using a Feedforward Loop Linearizer", Proceedings of the 36th European Microwave Conference, Manchester UK, Sep. 2006.

(Continued)

*Primary Examiner* — Thomas J Hiltunen
(74) *Attorney, Agent, or Firm* — Edward C. Kwok; Hogan Lovells US LLP

(57) ABSTRACT

In one embodiment a mixed-signal adaptive integrated circuit is comprised of a pre-distortion circuit operable to receive an RF input signal and to add a pre-distortion signal to the RF input signal to thereby provide a pre-distorted RF input signal, and a power amplifier coupled to the pre-distortion circuit and operable to receive the pre-distorted RF input signal and to provide an amplified RF output signal. The circuit further comprises a compensation module operable to receive the RF input signal and to provide a compensation signal, an auxiliary amplifier coupled to the compensation module and operable to selectively add the compensation signal to the amplified RF output signal, and a signal analyzer operable to receive and process the RF input signal and an RF output feedback signal to generate a first digital control signal for the pre-distortion circuit and a second digital control signal for the compensation module. A method for adaptive control of such a mixed-signal integrated circuit is also provided.

31 Claims, 13 Drawing Sheets

(56) References Cited

U.S. PATENT DOCUMENTS

| | | | |
|---|---|---|---|
| 6,711,217 B1 * | 3/2004 | Jeong | 375/297 |
| 6,798,843 B1 * | 9/2004 | Wright et al. | 375/296 |
| 6,831,512 B2 * | 12/2004 | Cavers et al. | 330/149 |
| 6,897,724 B2 * | 5/2005 | Gurvich et al. | 330/151 |
| 6,922,104 B2 | 7/2005 | Maniwa | |
| 6,940,916 B1 | 9/2005 | Warner et al. | |
| 6,950,009 B1 | 9/2005 | Nysen | |
| 7,038,540 B2 * | 5/2006 | Gurvich et al. | 330/151 |
| 7,081,795 B2 * | 7/2006 | Matsuura et al. | 330/149 |
| 7,098,731 B1 | 8/2006 | Wyszynski | |
| 7,110,739 B2 * | 9/2006 | Braithwaite | 455/276.1 |
| 7,113,036 B2 * | 9/2006 | Moffatt et al. | 330/149 |
| 7,123,086 B2 * | 10/2006 | Braithwaite | 330/52 |
| 7,129,790 B2 | 10/2006 | Midtgaard et al. | |
| 7,187,232 B2 * | 3/2007 | Braithwaite et al. | 330/52 |
| 7,233,629 B2 | 6/2007 | Auranen | |
| 7,268,620 B2 | 9/2007 | Nygren et al. | |
| 7,288,988 B2 | 10/2007 | Braithwaite | |
| 7,362,821 B1 | 4/2008 | Shirali | |
| 7,427,217 B2 | 9/2008 | Chou et al. | |
| 7,590,432 B2 | 9/2009 | Behzad et al. | |
| 7,616,702 B2 * | 11/2009 | Ishida | 375/298 |
| 7,646,239 B2 * | 1/2010 | Iwasaki | 330/151 |
| 7,804,359 B1 * | 9/2010 | Cova | 330/149 |
| 7,844,014 B2 | 11/2010 | Keerthi et al. | |
| 7,876,869 B1 | 1/2011 | Gupta | |
| 7,881,404 B2 * | 2/2011 | Ishikawa et al. | 375/296 |
| 8,010,075 B1 | 8/2011 | Roger | |
| 8,068,574 B2 | 11/2011 | Norris et al. | |
| 8,121,560 B1 * | 2/2012 | Anaraki et al. | 455/114.3 |
| 8,213,883 B1 * | 7/2012 | Broadwell | 455/114.3 |
| 8,351,877 B2 * | 1/2013 | Kim et al. | 455/114.3 |
| 8,412,132 B2 * | 4/2013 | Tang et al. | 455/114.2 |
| 2004/0142667 A1 * | 7/2004 | Lochhead et al. | 455/114.3 |
| 2005/0085198 A1 | 4/2005 | Anvari | |
| 2005/0200408 A1 | 9/2005 | Benjamin et al. | |
| 2006/0008027 A1 * | 1/2006 | Gao et al. | 375/297 |
| 2006/0091950 A1 * | 5/2006 | Hayase | 330/149 |
| 2008/0055000 A1 * | 3/2008 | Haramoto et al. | 330/51 |
| 2008/0139141 A1 | 6/2008 | Varghese et al. | |

OTHER PUBLICATIONS

Nitronex Corporation, "Wideband Doherty Amplifier for WiMAX", Application Note AN-003, Sep. 2007.

S. Wood et al., "A High Efficiency Doherty Amplifier with Digital Predistortion for WiMAX", High Frequency Electronics, Dec. 2008.

Broadwell et al., U.S. Appl. No. 12/257,292, filed Oct. 23, 2008, 39 pages.

Yu et al., U.S. Appl. No. 12/340,032, filed Dec. 19, 2008, 21 pages.

Broadwell, U.S. Appl. No. 12/190,781, filed Aug. 13, 2008, 29 pages.

* cited by examiner

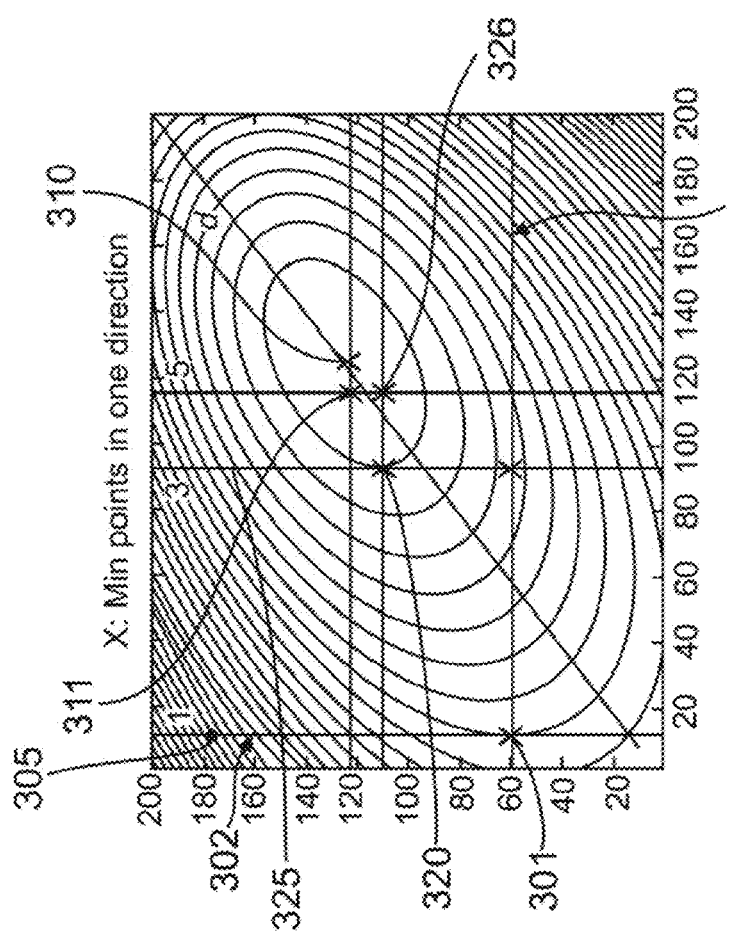
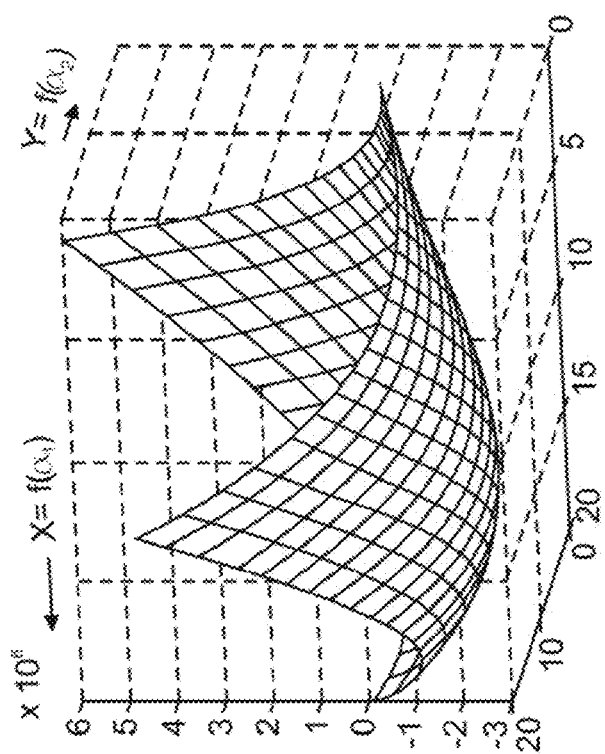
FIG. 3b
FIG. 3a

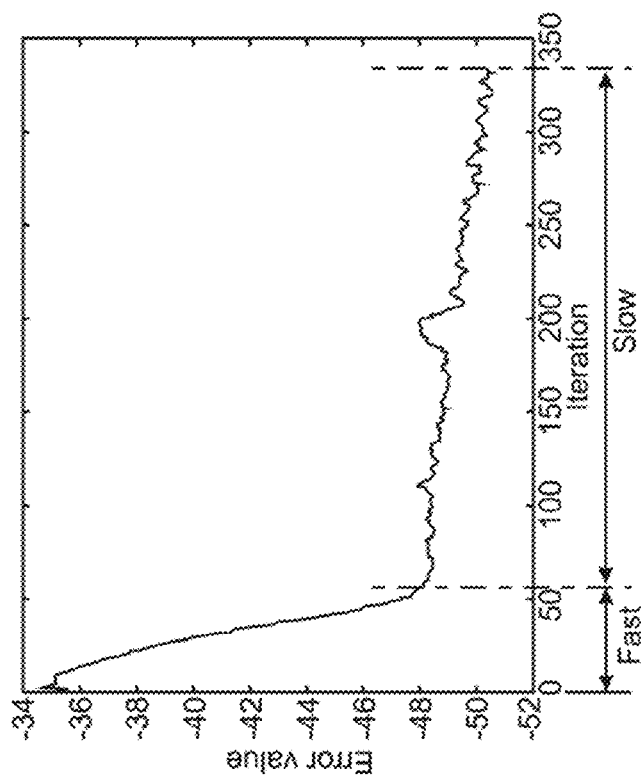

SELF-ADAPTIVE POWER AMPLIFICATION

CROSS-REFERENCE TO RELATED APPLICATIONS

This application claims priority to U.S. Provisional Application No. 61/139,524 filed Dec. 19, 2008, the contents of which are incorporated by reference herein for all purposes.

This application is related to U.S. application Ser. No. 12/257,292 filed Oct. 23, 2008, and U.S. application Ser. No. 12/340,032 filed Dec. 19, 2008, the contents of which are incorporated by reference herein for all purposes.

BACKGROUND

The present invention relates to linearization and more particularly to systems and methods for adaptive and optimized control of mixed signal integrated circuits.

Power amplifiers in communication systems are a main source of non-linearity, e.g., input signals are generally distorted during amplitude modulation, especially as the power nears the saturation level of the amplifier. Another source of non-linearity is memory effects. Generally, memory effects cause additional odd order, e.g., $3^{rd}$, $5^{th}$, $7^{th}$, etc., intermodulation distortion. Memory effects may include, but are not limited to, power amplifier self-heating and decoupling of the power amplifier from a power supply. In self-heating, as the power amplifier power level increases, heat is built up in the devices used in the power amplifier. Conversely, a decrease in the power level causes cooling of the devices. Such heating and cooling of the devices generally results in odd order distortion.

One method for reducing distortion and non-linearity is to operate the power amplifier in a linear region below its maximum power capacity, i.e., backing off. However, this would require a larger amplifier than would otherwise be the case, thereby, making the system less efficient and more expensive. This problem is made more severe by modern wide bandwidth modulation schemes, such as CDMA, WCDMA and UMTS, which employ signals with large random signal peaks. Therefore, it is highly desirable to reduce distortion while maintaining amplifier efficiency by reducing distortion without simply making the amplifier bigger. One approach is to pre-distort the input signal prior to amplification to correct for amplifier nonlinearities.

There are many methods for pre-distorting signals to linearize power amplifiers. Typically, a pre-distortion unit is placed between the input signal and the power amplifier, where the pre-distortion unit receives signals for distorting the input signal based on feedback signals from the amplifier output signal. Thus, before the signal is amplified, an estimate is made of the manner in which the amplifier will non-linearly distort the particular input signal by amplifying that signal. The signal to be amplified is then "pre-distorted" by applying to it a transformation in a manner estimated to be complementary to the non-linearity which the amplifier itself will apply as it amplifies the signal. Ideally, the pre-distorting transformation is cancelled out by the amplifier's non-linearity, resulting in an undistorted, amplified output signal. In general, conventional pre-distortion to reduce non-linearity was performed at baseband in the digital domain. But note that the non-linearity introduced by the power amplifier is analog and in the radio frequency (RF) domain. The resulting necessity to digitize and analyze the non-linearity at baseband results in unnecessary power consumption and complication.

An alternative to conventional pre-distortion techniques and systems is disclosed in commonly-assigned U.S. application Ser. No. 11/484,008, filed Jul. 7, 2006 (hereinafter the '008 application), the contents of which are incorporated by reference in their entirety, wherein the pre-distortion is performed in the RF domain rather than at baseband. In the '008 application, an error signal is calculated through comparison of a properly-scaled version of the amplified output signal from the power amplifier to the power amplifier's input signal. Should the power amplifier be perfectly linear, this error signal is zero. However, real-world power amplifiers will produce some non-linearity in the output signal such that the error signal is non-zero.

To pre-distort the power amplifier input signal in the RF domain, the input signal is typically multiplied with a pre-distorting signal. For example, an RF input signal may be represented by the real part of $\{R(t)*\exp(j\omega_c t)\}$, where $R(t)$ is the complex envelope, $j$ is the imaginary unit, $\omega_c$ is the angular frequency for the RF carrier bearing the complex envelope modulation, and $t$ is time. It may thus be seen that the pre-distortion signal is a baseband signal because the pre-distortion signal is a function of the complex envelope $R(t)$ and not of the RF carrier. In that regard, a pre-distortion signal may be represented by a Taylor series expression: $\alpha_1 + \alpha_2*R(t) + \alpha_3*R(t)^2 + \alpha_4*R(t)^3 + \ldots$, where the alpha symbols represent pre-distortion coefficients, which may also be denoted as pre-distortion weights. Upon multiplication of such a pre-distortion signal with the RF input signal, the resulting pre-distorted RF signal that is produced becomes the real part of $\{[\alpha_1*R(t) + \alpha_2*R(t)^2 + \alpha_3*R(t)^3 + \alpha_4*R(t)^4 + \ldots]*\exp(j\omega_c t)\}$. It is this pre-distorted RF signal that is supplied as an input signal to the power amplifier. The final envelope power in the pre-distorting signal depends upon the complexity of the design and desired precision. For example, suppose the final power in the series expression is five, corresponding to $R(t)^5$. In such an embodiment, it may be seen that a signal generator generating the pre-distorting signal must solve for six coefficients in the Taylor series, ranging from $\alpha_1$ to $\alpha_6$.

The envelope term associated with each pre-distortion weight in the pre-distortion signal may be designated as a corresponding monomial "basis" function. Thus, the monomial basis function associated with pre-distortion weight $\alpha_1$ is $R(t)^0$, the basis function associated with pre-distortion weight $\alpha_2$ is $R(t)$, the basis function associated with pre-distortion weight $\alpha_3$ is $R(t)^2$, and so on. The pre-distortion weights associated with the basis functions may be determined in a variety of fashions. In an example analytical approach, a signal generator may include a correlator for each pre-distortion weight. Each correlator correlates the error signal with the basis function corresponding to the correlator's pre-distortion weight. Although analytically correct in theory, it may be shown that such a selection of monomial basis functions will not typically produce desirable real-world results because the convergence time to a solution is too long. To enhance the convergence speed, the '008 application discloses that each basis function may be an orthonormal polynomial formed from the above-discussed mononomial basis functions.

Although the '008 application discloses a power amplifier linearization technique that has lower bandwidth demands, higher precision, and lower power consumption as compared to conventional schemes that perform their distortion in the digital baseband domain, correlation in the RF analog domain to generate the coefficients can lead to mismatches. This mismatch occurs because a correlation determines the pre-distortion weights for the basis functions used to create a pre-distortion signal for pre-distorting the RF input signal. A pre-distortion signal must then be created based upon these determined pre-distortion weights by multiplication with the basis functions. A second multiplication is then required to multiply the input signal with the resulting pre-distorting signal. Because of circuit non-idealities and other effects, the pre-distorting signal may have coefficients that are slightly different from the analog coefficients that result from the correlation. Moreover, even if such non-idealities could be eliminated, improvements in convergence speed are desirable.

Regardless of whether or not correlation is used to produce a pre-distorting signal, the input signal is distorted to form the pre-distorting signal based upon an analysis of an error signal that results from comparing a delayed version of the input signal to a version of the amplified output signal. This delayed version of the input signal should be delayed such that the delay matches a group delay introduced in the amplified output signal by the power amplifier. Small errors in such delay matching as well as gain and/or phase imbalances between the compared signals result in less-than-optimum linearization.

As noted above, pre-distortion is an effective technique to improve the power efficiency of a weakly-nonlinear power amplifier. However, if the RF signal has a large peak-to-average ratio (typical for broadband RF applications), the power amplifier may have very strong nonlinearity or even chip the signal peaks due to hard saturation of the amplifier. In theory, feedforward compensation can provide the highest performance for power amplifiers with strong nonlinearity, but traditional feedforward linearization has several drawbacks:

1) pilot tones are used for amplitude-phase-delay matching;
2) the matching accuracy is not guaranteed due to the lack of real-time performance monitoring; and
3) overall power efficiency is low due to the power consumption of the error amplifier, which has typically required continuous operation.

Accordingly, there is a need in the art for improved power amplification circuits and techniques for control of such circuits, in particular with regard to power amplifiers with strong nonlinearity such as for RF signals with large peak-to-average ratios.

SUMMARY

Mixed-signal adaptive integrated circuits and methods for adaptive control of such circuits are provided. A combination of an RF pre-distortion circuit and a compensation module including post-cancellation or feedforward compensation is provided. A signal analyzer allows for adaptive and real-time control of the RF pre-distortion circuit and the compensation module, and in one embodiment includes a single-chip integrated performance monitor. No pilot tones are required, and a burst-mode operation of an auxiliary amplifier significantly reduces power consumption.

Embodiments of the present invention are best understood by referring to the detailed description that follows.

DESCRIPTION OF THE DRAWINGS

FIG. 2b is a top view of the error space of FIG. 2a;
FIG. 3a is a perspective view of a two-dimensional error space having dependent dimensions;
FIG. 3b is a top view of the error space of FIG. 3a;
FIG. 4 illustrates the convergence rate for an example error space having dependent dimensions;
FIG. 6 illustrates a matrix for transforming pre-distortion coefficients to minimize the dependence in the resulting error space dimensions.

It should be appreciated that like reference numerals are used to identify like elements illustrated in one or more of the figures.

DETAILED DESCRIPTION

The following discussion is directed to the linearization of a power amplifier. However, it will be appreciated that the linearization techniques disclosed herein have broad application to the linearization of any ostensibly linear element that introduces some degree of non-linear distortion in its output signal.

To provide a linearization technique that has improved convergence speed as well as greater flexibility with regard to a selective spectral suppression of non-linearity, the error signal is calculated in the digital domain. This digital error signal calculation is advantageous in that efficient spectral transformation techniques such as a Fast Fourier Transform (FFT) may be performed on the resulting digital error signal to determine its power in various frequency bands. For example, if a power amplifier is used in a base station within a cellular communication network, the out-of-band interference introduced by non-linearities in the base station amplifier may interfere with communication by others in neighboring frequency bands. A spectral performance module (SPM) is disclosed to generate the error signal from a version of the power amplifier output signal (designated as RF FeedBack (RFFB)) to a version of the RF input signal (designated as RF Input Signal (RFINS)). The SPM performs digital signal operations to delay, amplitude match, and phase align RFFB and RFINS. The resulting matched signals are subtracted to compute a discrete time estimate of the error signal at complex baseband (designated as $e_{BB}(kT_s)$):

$$e_{BB}(kT_s) = \text{RFFB}(kT_s) - \text{RFINS}(kT_s - T_{PA}) \quad (1)$$

where RFINS is delayed by the value of a forward-observation path delay $T_{PA}$ through the power amplifier (PA) to delay match it to RFFB and $T_S$ represents the sampling period of the discrete signal sequences and k is an integer index.

The error signal $e_{BB}(kT_s)$ generated by the SPM contains information about the output distortion of the PA that is used to adaptively compute pre-distortion weights (the alpha-coefficients discussed previously) in order to minimize non-linear distortion in the power amplifier output signal. The SPM can then discriminate error energy in different frequency sub-bands as will be described further herein.

Figure 1:
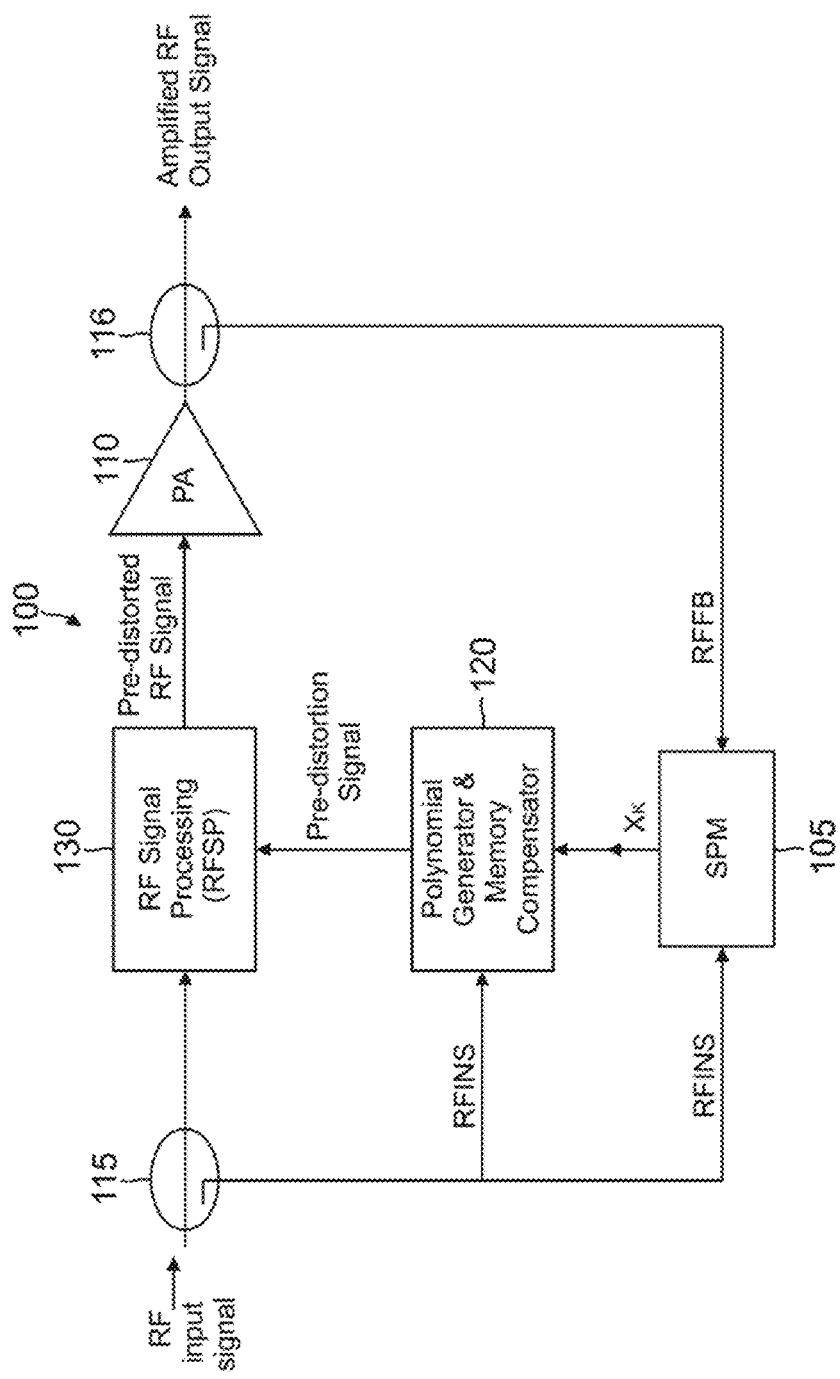
FIG. 1 is a system-level view of an example pre-distorter for linearizing a power amplifier.

Turning now to the drawings, FIG. 1 shows the integration of a spectral performance monitor (SPM) 105 within an example pre-distorter 100 for linearizing a power amplifier (PA) 110. SPM 105 receives RFINS and RFFB and calculates the error signal $e_{BB}(kT_s)$ as discussed above. In addition, SPM 105 drives an SPM coefficient adaptation algorithm responsive to the value of the error signal to generate the pre-distortion coefficients (which may also be designated as pre-distortion weights), represented by a vector $X_k$ for a given iteration step k. Signals RFFB and RFINS may be obtained using RF couplers 116 and 115, respectively.

A polynomial generator and memory compensator module 120 receives the vector $X_k$ as well as a version of RFINS. As will be explained further, module 120 includes an envelope detector to detect the envelope signal R(t) discussed previously as well as a power detector to detect the square of the envelope $R(t)^2$. Recall that a pre-distortion signal is a polynomial in the form of $\alpha_1 + \alpha_2 * R(t) + \alpha_3 * R(t)^2 + \alpha_4 * R(t)^3 + \ldots$, where the various higher powers of the envelope may be formed using appropriate multiplications of R(t) and $R(t)^2$. Thus, module 120 synthesizes the various monomial basis functions (powers of the envelope) and weights them according to the current pre-distortion weights from vector $X_k$ to provide the pre-distortion signal. To account for short-term and long-term memory effects in the power amplifier, module 120 adjusts the pre-distortion signal with feedforward and feedback techniques as will be discussed further herein.

An RF signal processing (RFSP) module 130 receives the RF input signal and multiplies this signal with the pre-distortion signal from module 120 to provide a resulting pre-distorted RF input signal to the power amplifier. Note that the majority of the power for the pre-distorted RF input signal will be in the linear term, which is the real part of $(\alpha_1 * R(t) * \exp(j\omega_c t))$. Commonly-assigned U.S. application Ser. No. 12/190,781, filed Aug. 13, 2008, (hereinafter the '781 application), the contents of which are incorporated by reference in their entirety, discloses an RFSP that exploits this power difference between the linear term and the non-linear terms in the pre-distorted RF input signal to maximize dynamic range and minimize noise during the production of this signal. These three main components of pre-distorter 100 (the SMP, the polynomial generator and memory compensator, and the RFSP) will now be discussed in greater detail, beginning with the SPM.

The Spectral Performance Monitor (SPM)

As discussed with regard to the '008 application, one technique to calculate the pre-distortion weights for a given iteration of vector X (designated as the kth iteration, $X_k$) is to correlate the error signal with various basis functions. However, a greater convergence speed for calculating the pre-distortion weights may be achieved through an iterative non-linear optimization technique. The number of pre-distortion weights depends upon the polynomial order one wishes to correct for in the pre-distorted RF input signal that will be produced for driving the power amplifier. For example, if the pre-distorted RF input signal includes up to the $7^{th}$ power of the envelope R(t), the error signal is represented by 14 dimensions because of the in-phase (I) and quadrature-phase (Q) versions of the various complex envelope powers.

Regardless of the desired final envelope power in the pre-distorting signal (and hence dimensions that will be used in the error signal), the pre-distortion weights may be represented by a vector $X_k$ at an arbitrary calculation step k. The non-linear optimization occurs with regard to a cost function f of the vector $X_k$ that is represented as $f(X_k)$. A mathematically optimum cost function is the mean square of the error signal (MSE). However, other cost functions may also be implemented. The expression for a subsequent iteration (k+1) may then be represented as:

$$X_{k+1} = X_k - \lambda_k * \nabla f(X_k) \qquad (2)$$

where $\nabla f(X_k)$ represents the gradient of the cost function and $\lambda_k$ is an optional weighting.

Figure 2B:
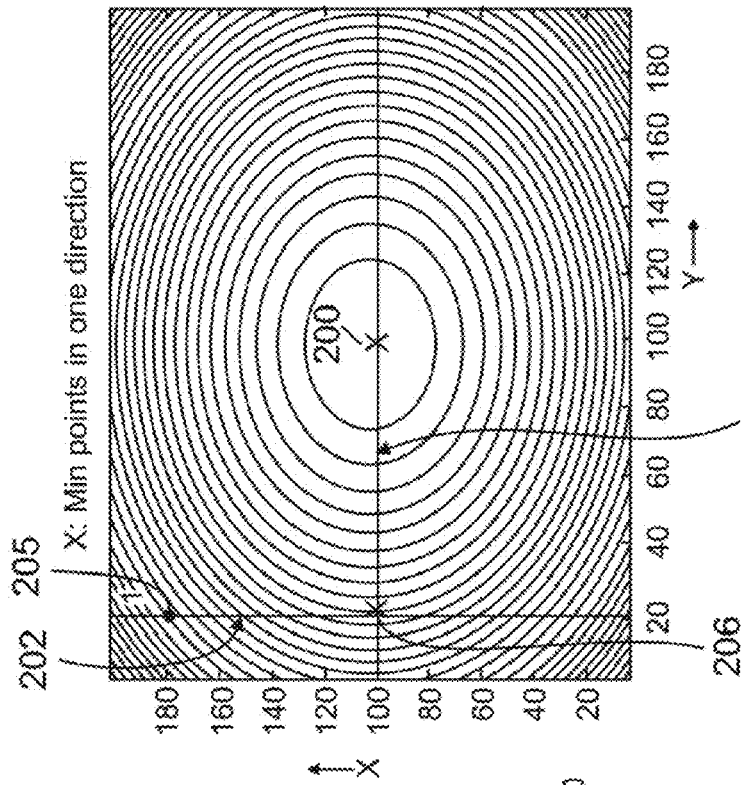
Figure 2A:
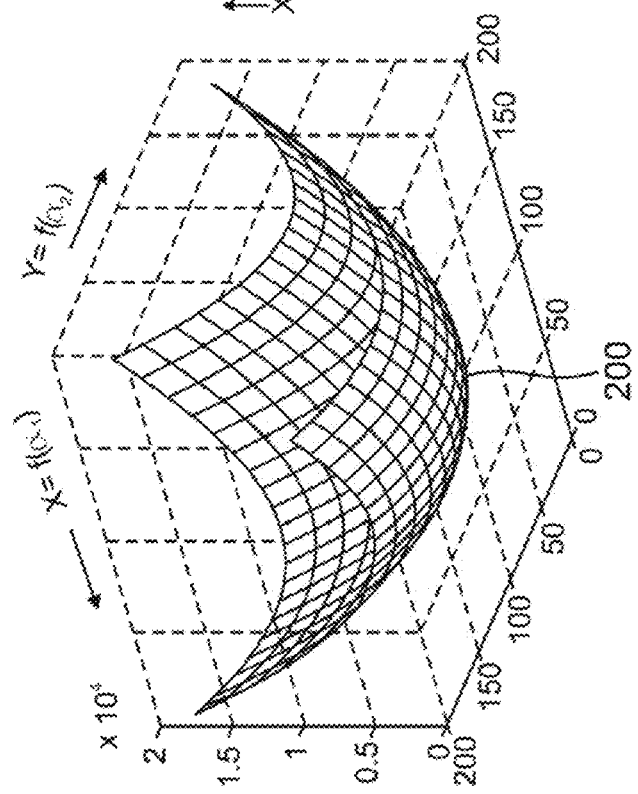
FIG. 2a is a perspective view of a two-dimensional error space having independent dimensions.

Algorithms will be discussed below for iteratively calculating the pre-distortion weights based upon equation (2). For example, consider a simplified example wherein the power amplifier's non-linear distortion is merely quadratic (thereby producing a square of the envelope R(t) in the amplified output signal. In such a case, there are only two correlation weights that need adjusting in the pre-distorted RF signal that is supplied to the power amplifier such that the pre-distorted RF signal may be represented as the real part of $((\alpha_1 * R(t) + \alpha_2 * R(t)^2) * \exp(j\omega_c t))$. Although both the alpha coefficients are complex numbers, the following discussion will treat them as scalars for clarity of illustration. In such an example, there would thus be just two "knobs" (corresponding to $\alpha_1$ and $\alpha_2$) that can be adjusted so as to minimize the resulting error signal. The resulting two-dimensional error space may be as illustrated in shown in FIG. 2a. A first "x" dimension for this error space corresponds to a function of one of the pre-distortion weights (e.g., $\alpha_1$) whereas the remaining "y" dimension for the error space corresponds to a function of a remaining one of the pre-distortion weights (in this case, $\alpha_2$). There is a minimum error corresponding to a point 200 produced by corresponding values of x and y as determined by appropriate values of $\alpha_1$ and $\alpha_2$). A priori, an SPM does not know the optimum settings for at and $\alpha_2$ but must instead search for them by iteratively setting certain values for these coefficients and testing the resulting error that is produced. Such an iterative search is considerably simplified if the error space dimensions are independent such as shown in FIG. 2a. This independence is better illustrated through a plan view of this error space as shown in FIG. 2b. The error dimensions are independent because a minimum in the dimension x does not depend upon the dimension y and vice-versa. For example, suppose an SPM initially selected a value for the alpha coefficients corresponding to point 205 in FIG. 2b. If $\alpha_2$ is kept constant and $\alpha_1$ changed in increments to define points along a line 202 and the resulting error tested, a minimum error (as a function of just x which in turn is a function of $\alpha_1$) may be found at a point 206. Because of the dimension independence, the x value for the true error minimum (point 200) will not be different from the x dimension for the local minimum at point 206. Thus, the SPM may then keep as constant and begin varying $\alpha_2$ such that the error space is traversed across a line 208 until the true minimum is reached at point 200.

Figure 5:
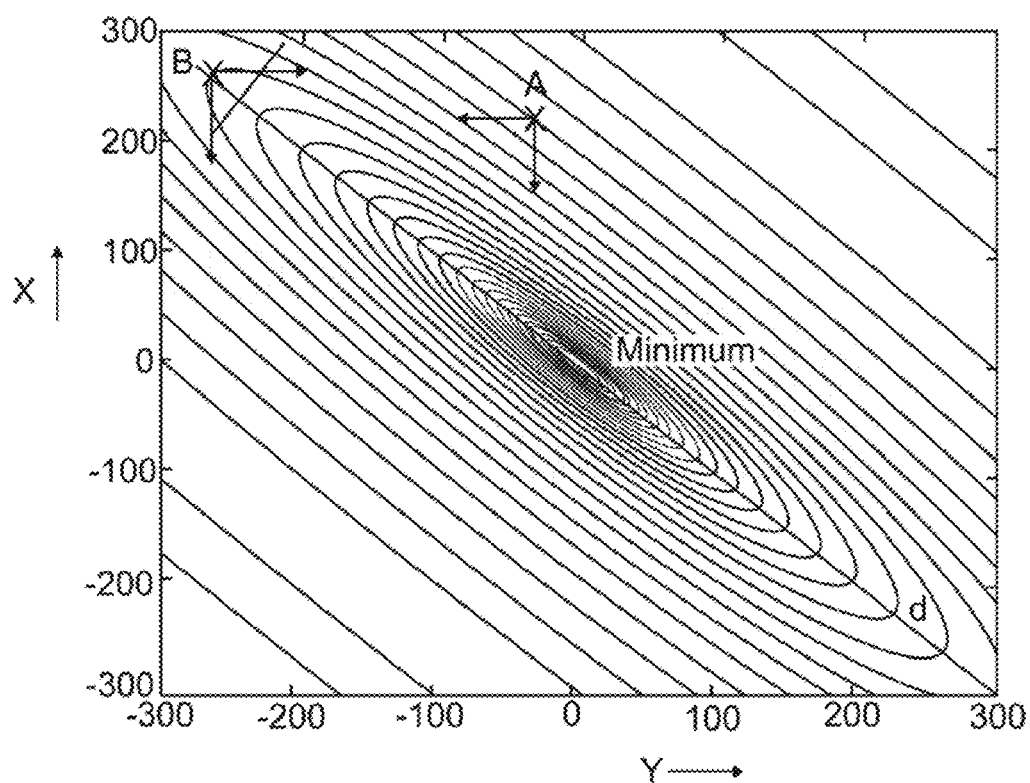
FIG. 5 is a top view of another dependent-dimension error space.

Finding a minimum value in the error space is not so straightforward if the error dimensions are dependent as shown in perspective view in FIG. 3a and in plan view in FIG. 3b. Because of the dimension dependence, a local minimum 301 found on a line 302 as $\alpha_1$ is varied from an arbitrary starting point 205 and $\alpha_2$ kept constant has a different x-dimension than that for a true minimum location 310 in the error space. As a result, an iterative search for the true minimum location will "ping-pong" between the dimensions as it drifts from local minimum to local minimum. For example, if the x-dimension is kept constant as y is varied from location 301 along a line 315, another local minimum location 321 is determined. To find the true minimum, another x-dimension change leads to a local minimum location 320 along a line 325. Successive iterations in respective dimensions leads to additional local minimum 326 and 311 before finding true minimum location 310. It will be appreciated that for more complex error spaces such as the 14-dimensional space discussed previously, the convergence to a solution can thus become burdensomely slow in a dependent error space. However, real-world power amplifiers will generally produce error spaces that have dependent dimensions with respect to the pre-distortion weights $\alpha_1$, $\alpha_2$ and so on discussed previously for the various envelope powers in the pre-distorted RF input signal that drives the power amplifier. If these pre-distortion weights are changed in an iterative fashion as discussed analogously with regard to FIG. 2a through 3b, a convergence to a solution may resemble the example convergence rate shown in FIG. 4, where a relatively large reduction in the error value is achieved over the first 50 iterations but then much more slowly over the subsequent several hundred iterations. Moreover, as shown in the dependent error space of FIG. 5, if the increment that the SPM adjusts the x or y dimensions is sufficiently large so as to attempt to decrease the required number of iterations, a false minimum is detected at a point B as opposed to iterations from a point A.

It can thus be seen that the dependent dimensions for the error spaces of real-world power amplifiers leads to at least two problems: poor convergence and the possibility of false minimums. To improve convergence speed and lower the false minimum probability, a correlation matrix and decomposition technique could be performed but at a heavy computation cost. To provide a more efficient solution to error dimension independence, the SPM iteratively changes abstract pre-distortion weights as discussed above. In one embodiment, these weights are "abstract" because they are not applied to the various envelope powers to form the pre-distorted RF input signal to the power amplifier. Instead if a vector $A_{RFPAL}$ represent a seven-dimension vector of the actual pre-distortion weights and a vector $A_{Alg}$ represents the seven abstract weights adapted by the SPM, a simple fixed transformation of $$A_{RFPAL} = T A_{Alg} \quad (3)$$

where T is a matrix as shown in FIG. 6 leads to much greater independence in the error dimensions. It will be appreciated that the linear transformation represented by matrix T would be applied to both the in-phase (I) and quadrature-phase (Q) portions of the complex-valued pre-distortion weights that are iteratively adapted by the SPM. Other linear transformations may be derived using simulations and numerical methods for a given power amplifier accordingly should the error space be varied from seven dimensions.

Referring back to equation (2), the SPM may then iteratively adapt the vector $X_k$ (corresponding to given values for the vector $A_{Alg}$ just discussed at an arbitrary kth iteration, k being a positive integer) in a number of fashions. The cost function f is a function of the error signal, with the mean square of the error being the mathematically most ideal cost function. The gradient of the cost function $\nabla f(X_k)$ is defined as the vector $[\Delta f(X_k)/\Delta x_{1,k}, \ldots, \Delta f(X_k)/\Delta x_{n,k}]$, where $x_{j,k}$ represents the jth component of the vector $X_k$. To calculate the gradient, each pre-distortion coefficient (in the pre-transformed space) is changed by a small value and the cost function measured.

Although one could iteratively adapt the coefficients in this fashion as given by equation (2), convergence and accuracy may be increased by adapting the pre-transformed pre-distortion coefficients as follows. Let sets Mk and Mk+1 be defined as the sets containing the pre-transformed pre-distortion coefficients at iteration steps k and k+1, where an "iteration step" refers to the update of all vector components. For each dimension in updating iteration k, the updating process can be written as $$X_{next}^i = X_{k+1}^i - \lambda_{k+1} \nabla_{k,k+1}^i f(X_{\{i+,\ldots,n\} \in Mk}^{\{1,\ldots,i-1\} \in Mk+1}) \quad (4)$$

where $X_k^i$ is the $i^{th}$ component of vector X at iteration k, $X_{\{i+,\ldots,n\} \in Mk}^{\{1,\ldots,i-1\} \in Mk-1}$ represents vector X when its first $i^{th}$ components are updated to new values from iteration k+1 and components (i+1) to n are still from the $k^{th}$ iteration, n is the integer number n of dimensions in the vector X, and $\nabla_{k,k+1}^i f(X_{\{i+,\ldots,n\} \in Mk}^{\{1,\ldots,i-1\} \in Mk-1})$ is an estimate of the gradient of the cost function for dimension i at point $X_{\{i+,\ldots,n\} \in Mk}^{\{1,\ldots,i-1\} \in Mk-1}$ when $X_k^i$ proceeds to $X_{k+1}^i$. After the nth step in an iteration k, $X_{next}$ serves as $X_{k+1}$ for the subsequent iteration. It can be shown that such an iteration to solve equation (2) leads to optimal convergence. In addition, a random permutation in the order of dimensions for which the gradient is being calculated will inhibit the false minimum problem discussed with regard to FIG. 5.

Referring back to FIG. 1, if the RF input signal is assumed to be stationary and ergodic, the optimum cost function is the mean square error $M_0$ as given by the following equation $$M_0 = E\{|RFFB(t) - K*RF_{delay}(t)|^2\} \quad (5)$$

where E is the expected value operation, $RF_{delay}(t)$ is a delayed version of RFINS, and K is a gain factor that minimizes the metric. More precisely, without considering pre-distortion, K is a gain set such that the error is orthogonal to $RF_{delay}(t)$. It can be shown that K is thus given by the following expression:

$$K = \frac{\int RFdelay(t) RFFB(t) dt}{\int RFdelay(t) RFdelay(t) dt} \quad (6)$$

Calculating the error signal in the digital domain leads to efficient spectral transformations such as the Fast Fourier Transform (FFT) that may be used to calculate spectral parameters such as the power spectral density (PSD) of the error signal, represented as $S_c(f)$, where f is frequency. The mean square error $M_0$ can be rewritten as the integral over frequency of $S_c(f)$. But note that the spectral transformation of the error signal leads to interesting and advantageous results. For example, if a power amplifier is to amplify an input signal limited to an in-band bandwidth (all other frequencies being considered out-of-band), the integral of the PSD for the error signal may be calculated separately for the in-band and out-of-band portions. In this fashion, the cost function can be made to depend upon linear combinations of the in-band and out-of-band PSDs for the error signal. This is advantageous because mismatches in phase, delay, and gain between RFFB(t) and $RF_{delay}(t)$ cause non-idealities in the resulting pre-distortion solution. But if the cost function is made to depend solely upon functions of out-of-band PSD for the error signal, such non-idealities will be minimized since $RF_{delay}(t)$ will have little out-of-band energy. Thus, inaccuracies in delay matching $RF_{delay}(t)$ to RFFB in such an out-of-band embodiment will have relatively little effect on the resulting error signal.

A common criteria of performance for power amplifiers in cellular base stations is to minimize the adjacent channel leakage ratio (ACLR): A cost function may be generated that more directly corresponds to ACLR. For example, one approach is to minimize the multiplication of power in different spectral regions. For example, the cost function could be broken down into 3 values, corresponding to a function of the energy in the error signal PSD in a lower frequency band as compared to an energy for an in-band error signal PSD and as compared to the energy in the error signal PSD in a higher frequency band as compared to the in-band portion. In one embodiment, at each iteration step, the gradient is taken for either the lower or upper out-of-band error spectra, whichever is greater. In this fashion, the ACLR may be minimized.

To implement the iterative adaptation of the pre-distortion weights, the SPM may comprise a microprocessor, digital signal processor, programmable logic device, or micro-controller. Alternatively, a dedicated ASIC could be used to instantiate the SPM. Regardless of the implementation for the SPM, non-idealities should be avoided in calculating the error signal from RFFB and RFINS. The error calculation by the SPM will now be discussed.

SPM Error Signal Calculation

As discussed above, the pre-distortion weights may be formed by iteratively adapting them based upon a cost function of the error signal. Although the iterative adaptation provides rapid convergence to a solution, such a solution is buttressed on a proper formation of the error signal. In particular, accurate error signal formation is quite sensitive to the group delay mismatch between signals RFINS and RFFB discussed with regard to FIG. 1. As shown in FIG. 1, SPM 105 receives signals RFINS and RFFB to calculate an error signal. The input signal RFINS should be delayed by the group delay through power amplifier 110 so that an "apples-to-apples" comparison may be made to form the error signal. If RFINS is not properly delayed, the error signal does not represent the true error but is instead distorted by the asynchrdnicity between the delayed version of RFINS and RFFB. In addition, phase and gain imbalances should be addressed before forming the error signal.

Figure 7:
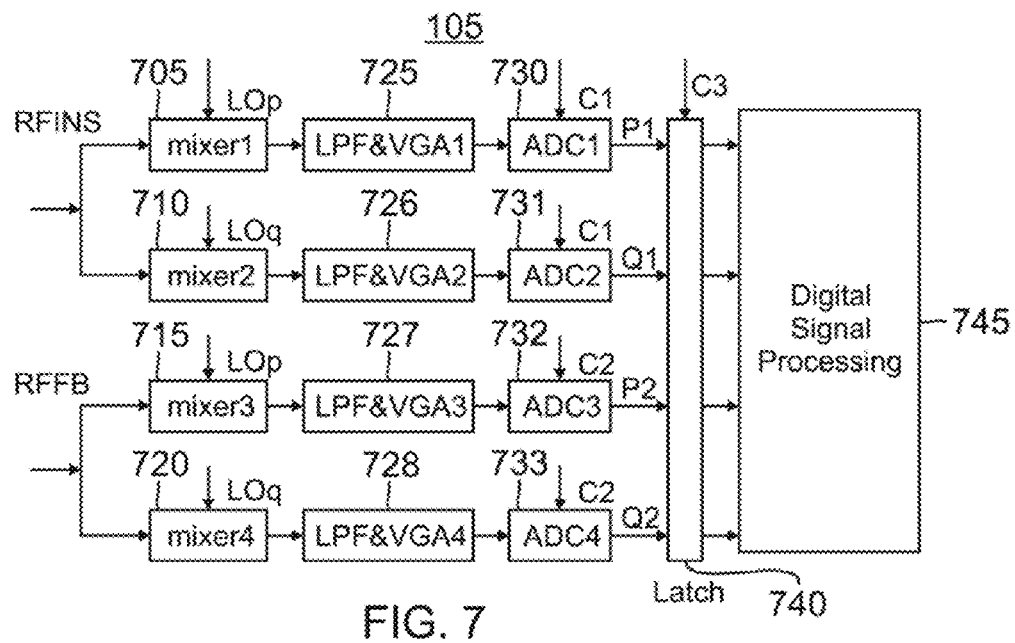
FIG. 7 illustrates some digital hardware within the SPM of FIG. 1 for time-aligning, gain-matching, and phase-aligning the RF feedback signal and the RF input signal prior to calculating the error signal.

Referring now to FIG. 7, an example SPM 105 is shown in greater detail to illustrate circuitry for forming the error signal. RFINS and RFFB (introduced with respect to FIG. 1) are quadrature demodulated into in-phase (I) and quadrature-phase (Q) signals. A source such as a phase-locked loop (PLL) (not illustrated) provides an in-phase local oscillator (LOp) to a mixer 705 to demodulate RFINS into an in-phase intermediate frequency (IF) version of RFINS. Alternatively, the PLL may have an output signal frequency such that mixer 705 directly down-converts RFINS into an in-phase baseband version of RFINS. The PLL also provides a quadrature-phase LO signal (LOq) to a mixer 710 to demodulate RFINS into a quadrature-phase IF or baseband (depending upon whether a heterodyne or direct downconversion architecture is implemented) version of RFINS. A similar demodulation of RFFB through a mixer 715 and a mixer 720 produces I and Q versions of RFFB, respectively.

The resulting I and Q signals may be each processed through a corresponding low pass filter (LPF) and variable-gain amplifier (VGA) 725 through 728. The gain adjusted and filtered output signal from LPF & VGA 725 is digitized in an analog-to-digital converter (ADC) 730 responsive to a clock signal C1. Similarly, the output signal from LPF & VGA 726 is digitized in an ADC 731 responsive to the clock signal C1.

However, the output signal from LPF & VGA 727 is digitized in an ADC 732 responsive to a clock signal C2 as is the output signal from LPF & VGA 728 digitized by an ADC 733 responsive to the clock signal C2. The digitized output signals from ADCs 730-733 may then be latched at a latch 740 responsive to a clock signal C3 before processing within a processor such as a digital signal processor (DSP) 745. The resulting digital in-phase and quadrature-phase baseband (or IF) versions of RFINS are designated as P1 and Q1, respectively. Similarly, the digital in-phase and quadrature-phase baseband (or IF) versions of RFFB are designated as P2 and Q2, respectively.

Figure 8:
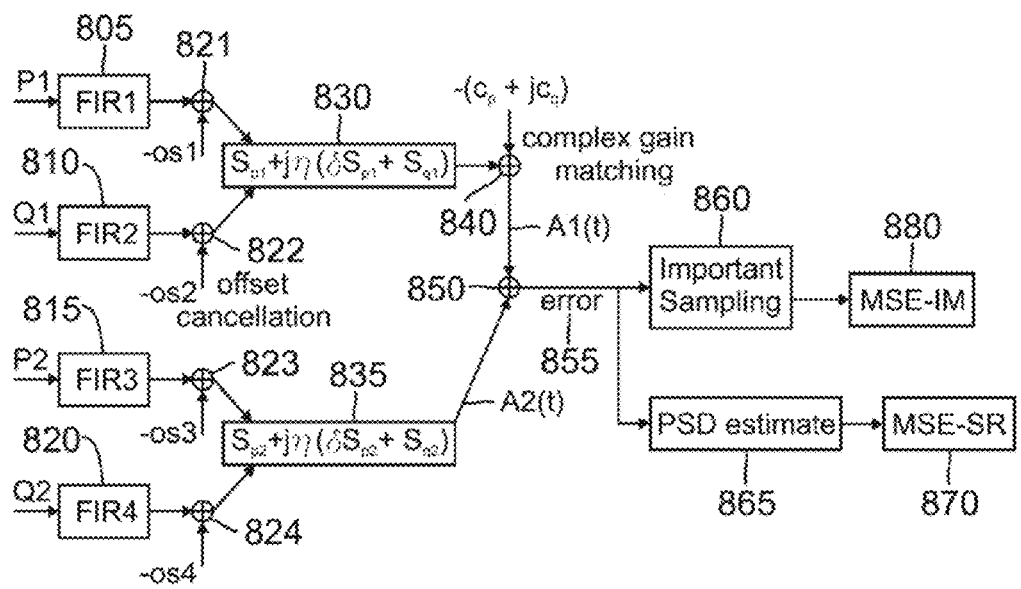
FIG. 8 illustrates additional digital signal processing within the SPM of FIG. 1 for time-aligning, gain-matching, and phase-aligning the RF feedback signal and the RF input signal prior to calculating the error signal.

Turning now to FIG. 8, digital signal processing steps administered by DSP 745 are illustrated. Signals P1, Q1, P2, and Q2 are filtered in finite impulse response (FIR) filters 805, 810, 815, and 820, respectively. To offset any imbalances between the I and Q signal portions, the output signal from each FIR may be added to an offset signal. For example, an offset signal os1 adds to filtered P1 in an adder 821 whereas filtered signals Q1, P2, and Q2 are added to offset signals os2, os3, and os4 in corresponding adders 822, 823, and 824, respectively. By adding the output signals from adders 821 and 822, a combined complex signal 830 is formed as the quantity $(S_{P1}+j\eta(\delta S_{P1}+S_{Q1}))$ where $S_{P1}$ represents the filtered output signal from filter 805, $S_{Q1}$ represents the filtered output signal from filter 810, and factors $\delta$ and $\eta$ results from the offset cancellation provided by offset signal os1 and os2. Similarly, by adding the output signals from adders 823 and 824, a combined complex signal 835 is formed as the quantity $(S_{P2}+j(\delta S_{P2}+S_{Q2}))$ where $S_{P2}$ represents the filtered output signal from filter 815, $S_{Q2}$ represents the filtered output signal from filter 820, and factors $\delta$ and $\eta$ results from the offset cancellation provided by offset signal os3 and os4. The SPM includes an adder 840 for adjusting signal 830 by a complex gain matching factor $-(Cp+j(Cq))$ to form a delayed, gain-adjusted, and phase-adjusted version of RFINS designated as signal $A1(t)$, where Cp is the real part of a complex gain adjusting coefficient C and Cq is the imaginary part of coefficient C. Similarly, signal 835 represents a delayed, gain-adjusted, and phase-adjusted version of RFFB designated as signal $A2(t)$. An adder 850 forms an error signal $e_{BB}(kT_s)$ 855 as $A2(t)-C^*A1(t)$, where C is the complex gain adjusting coefficient.

In one embodiment, the SPM selects coefficient C so as to minimize the mean-square error. Thus, C can be calculated from the following expression:

$$C=\Sigma_k A1^*(tk)A2(tk)/\Sigma_k A1^*(tk)A1(tk)$$

where $A1(tk)$ represents the value of $A1(t)$ at a particular time increment tk, $A1^*(tk)$ represents the complex conjugate value of $A1(t)$ at time tk, and $A2(tk)$ represents the value of $A2(t)$ at time tk. In this fashion, the signals RFINS and RFFB may be properly delayed, gain-matched, and phase-matched to compensate for group delays and gain and phase imbalances. Referring back to FIG. 7, it may be seen that clock signals C1 and C2 act as coarse time delay adjustment factors whereas FIR filters 805 through 820 act as adjustable delay lines to provide a fine time delay adjustment. The SPM adjusts these factors to minimize the mean square of error signal 855.

Referring again to FIG. 8, the SPM may form a cost function of the error signal 855 using either a time-domain analysis such as important sampling 860 or a spectral decomposition technique such as through forming the power spectral density (PSD) 865. Both techniques will tend to minimize the mean square of the error signal (MSE). Thus, the SPM may provide a spectrally-resolved MSE (designated as MSE-SR 870) or an importance-sampled MSE (designated as MSE-IM 880). As known in the art, an importance sampling may act to minimize large error magnitudes and/or a large amplitude in signal A1(*t*). Having generated the error signal and iteratively adapted pre-distortion weights according to a cost function based on the error signal, the SPM is then ready to provide the current pre-distortion weights to polynomial generator and memory compensator module 120. This module will now be discussed in greater detail.

The Polynomial Generator and Memory Compensator

Figure 9:
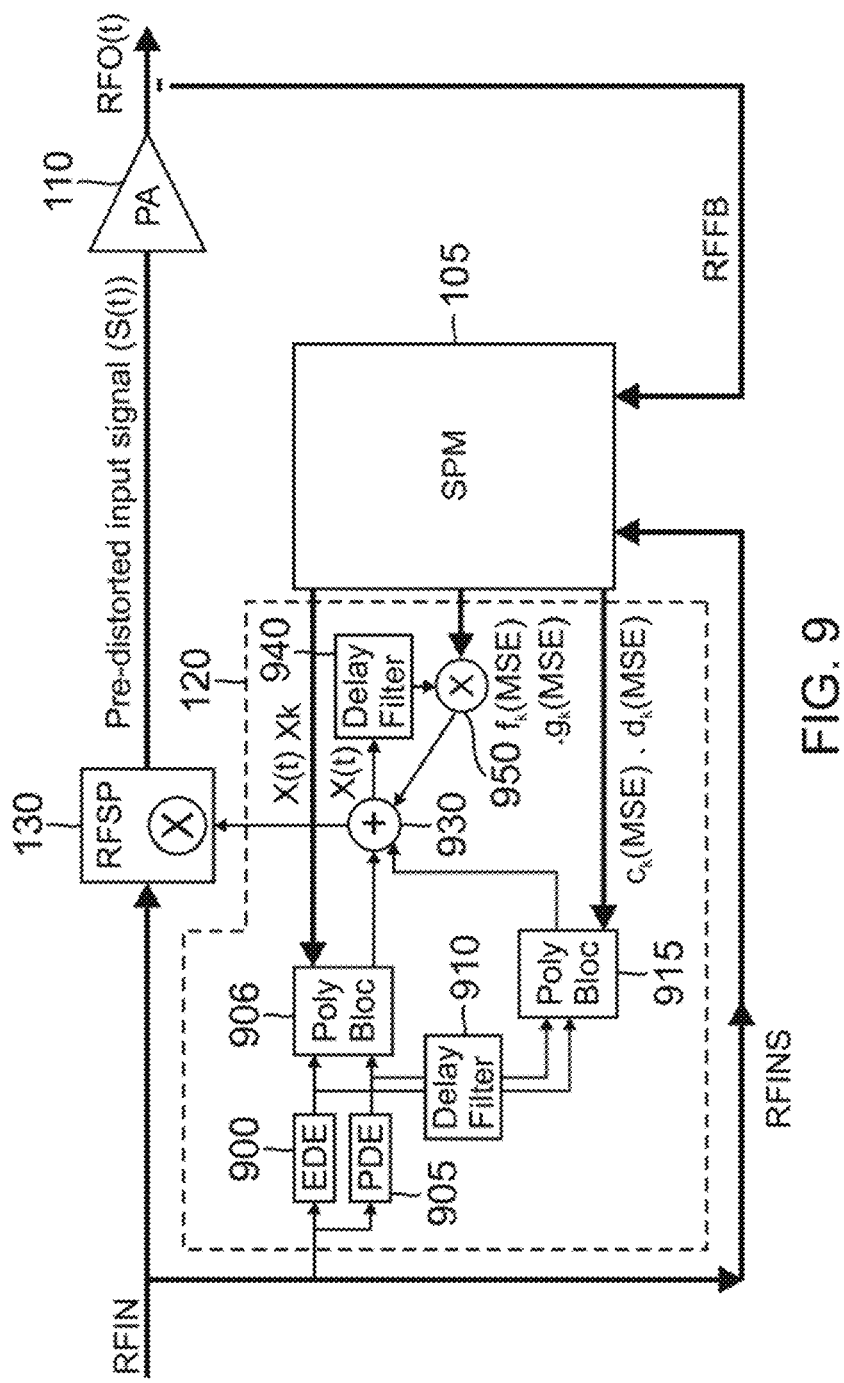
FIG. 9 illustrates signal processing details for a polynomial generator and memory compensator module in the pre-distorter of FIG. 1.

Referring again to FIG. 1, polynomial generator and memory compensator module 120 acts to form the pre-distortion signal provided to RFSP 130 responsive to the current pre-distortion weights calculated by SPM 105 (represented as vector $X_k$). Referring now to FIG. 9, an example polynomial generator and memory compensator module 120 is shown in further detail. Module 120 may use both feedback and feedforward mechanisms to account for memory effects within power amplifier 110. Memory effects within power amplifier 110 cause its amplified output signal, which is designated as RF Out (RFO(t)), to depend upon past behavior of the amplifier input signal. For example, if the pre-distorted RF input signal provided to the power amplifier is represented as S(t), then an example memory-effect-dependent RFO(t) may be represented as a function of S(t)+S(t−Td)+S(t−2*Td)+ . . . S(t−n*Td), where Td represents a memory effect delay and n is an arbitrary positive integer. If the SPM were to adapt a set of pre-distortion weights merely to weight S(t), the non-linearities introduced by the memory effects of S(t−Td) and other delayed versions of S(t) would be unaddressed. To address the memory etTects, module 120 includes an envelope detector (EDE) 900 to detect the envelope R(t) and a power detector 905 to detect $R(t)^2$. Recall that the polynomial order in the pre-distorted RF input signal provided to the power amplifier is arbitrary and is a tradeoff between algorithmic complexity and the degree of linearization desired. In one embodiment, RFSP 130 generates up to the $7^{th}$ power of the envelope in the pre-distorted RF input signal. To generate the necessary envelope powers, the envelope and the envelope squared terms from detectors 900 and 905 may be multiplied as necessary in a first polynomial module 906. In that regard, R(t) multiplied by $R(t)^2$ produces $R(t)^3$, and so on. First polynomial block 906 uses the resulting non-delayed powers of the envelope and the current pre-distortion weight vector $X_k$ from SPM 105 to generate a current pre-distortion signal such as the polynomial $\alpha_1 + \alpha_2 * R(t) + \alpha_3 * R(t)^2 + \alpha_4 * R(t)^3 + \ldots$ discussed previously.

To account for memory effects, the envelope and envelope squared terms are delayed in a delay filter bank 910 according to the memory order one wishes to account for in the resulting system. Delay filter bank 910 is designated as a "bank" because it may comprise a plurality of delay filters arranged in parallel, where each delay filter provides a unique delay equaling a integer multiple of a delay increment. For example, if the pre-distorted RF input signal to the power amplifier is to include only the delay terms S(t−Td) and S(t−2*Td) discussed above, then delay filter bank 910 would have a first delay filter configured to produce a delayed version of the envelope as R(t−Td) and a second delay filter configured to provide another delayed version of the envelope as R(t−2*Td). The delay factor Td is variable and can be adjusted according to a particular power amplifier's memory effects. Should the pre-distorted RF input signal provided to the power amplifier include only the two delay terms discussed above, delay filter bank 910 would also produce two different delayed versions of the envelope squared term $R(t-Td)^2$ and $R(t-2*Td)^2$. A second polynomial module 915 receives pre-distortion weights from SPM 105 to generate corresponding polynomials from these delayed envelope signals. Module 915 may generate the necessary delayed powers of the envelope by multiplying the delayed envelope signal and the delayed envelope squared signal analogously as discussed for module 906. In this fashion, module 915 produces $R(t-Td)^3$, $R(t-Td)^4$, $R(t-2Td)^3$, $R(t-2Td)^4$, and so on. If delay bank 910 is configured to produce the two different delayed versions of R(t) and $R(t)^2$ discussed above, then a first delayed polynomial from module 915 could correspond to $\alpha_1' + \alpha_2'*R(t-Td) + \alpha_3'*R(t-Td) + \alpha_4'*R(t-Td)^3 + \ldots$, where the pre-distortion weights are annotated with a prime symbol because they may be separately adapted by SPM 105. In other words, SPM 105 would adapt not only vector $X_k$ but also a vector $X_k'$, which is a vector of the pre-distortion weights for the first delayed polynomial. This iterative adaptation for vector $X_k'$ would occur in parallel in the same fashion as discussed above for vector $X_k$. Alternatively, the same pre-distortion weights may be used for both polynomials, albeit at the cost of increasing non-linearity. Referring again to the example of two independently-delayed output signals from delay filter bank 910, a second polynomial from module 915 would correspond to $\alpha_1'' + \alpha_2''*R(t-2Td) + \alpha_3''*R(t-2Td)^2 + \alpha_4''*R(t-2Td) + \ldots$, where the pre-distortion weights are annotated with a double prime symbol because these weights may be independently adapted by the SPM as compared to the remaining pre-distortion weights. In this fashion, module 915 produces delayed polynomials according the memory effect order one desires to address.

The resulting polynomials from modules 906 and 910 may be added in an adder 930 that provides the pre-distortion signal (designated as x(t)) to RFSP 100. To address both short-term and long-term memory effects, module 120 may include a feedback of signal x(t) through a delay filter bank 940. Filter bank 940 is analogous to delay filter bank 910 in that delay filter bank 940 may comprise a plurality of delay filters arranged in parallel, where each delay filter provides a unique delay equaling an integer multiple of the delay increment Td. Each of the various delayed versions of x(t) provided by delay filter bank 940 may then be weighted by a feedback pre-distortion coefficient provided by SPM 105 in a multiplier 950, where SPM 105 iteratively adapts these coefficients as discussed previously for the other pre-distortion coefficients. An output signal from multiplier 950 is summed by summer 930 and is thus feedback into signal x(t) provided to RFSP 130 as the pre-distortion signal. An example embodiment for RFSP 130 will now be discussed.

The RFSP

In one embodiment, the RFSP implements additive pre-distortion as discussed with regard to the '781 application. Such additive pre-distortion exploits the weakly non-linear nature of non-linear circuits such as power amplifiers. In other words, amplifiers are designed to be predominately linear such that a linear portion of an amplifier output signal is more powerful than a non-linear portion of the output signal. Appropriate pre-distortion of an amplifier input signal will thus mirror this imbalance between linearity and non-linearity—the linear portion in the pre-distorted amplifier input signal S(t) of FIG. 9 is more powerful than the non-linear portion. Although the non-linear portion of the pre-distorted input signal is relatively weak, it is inherently noisier than the linear portion because of the non-linear operations necessary to produce the various powers of the envelope. To prevent the domination of the signal-to-noise ratio (SNR) in the pre-distorted RF input signal by the noisy non-linear components, the non-linear components in the pre-distorted input signal are formed separately from the linear term such that the pre-distorted input signal is formed by the addition of the non-linear and linear terms. This additive pre-distortion is very advantageous because the signal-to-noise ratio in the pre-distorted input signal is not polluted by the relatively noisy nature of the non-linear terms.

To separate the linear and non-linear formation of the pre-distorted input signal, the non-linear signal portion of the pre-distorted input signal may be formed at a mixer from a version of the input signal and a pre-distorting signal. A first coupler may be used to extract the version of the input signal provided to the mixer such that the input signal is divided into a remaining input signal portion and the extracted version. A second coupler may be used to add the non-linear signal portion from the mixer with the remaining input signal portion to form the pre-distorted input signal. A variable gain amplifier may be used to amplify the remaining input signal portion prior to addition with the non-linear signal portion.

Figure 10:
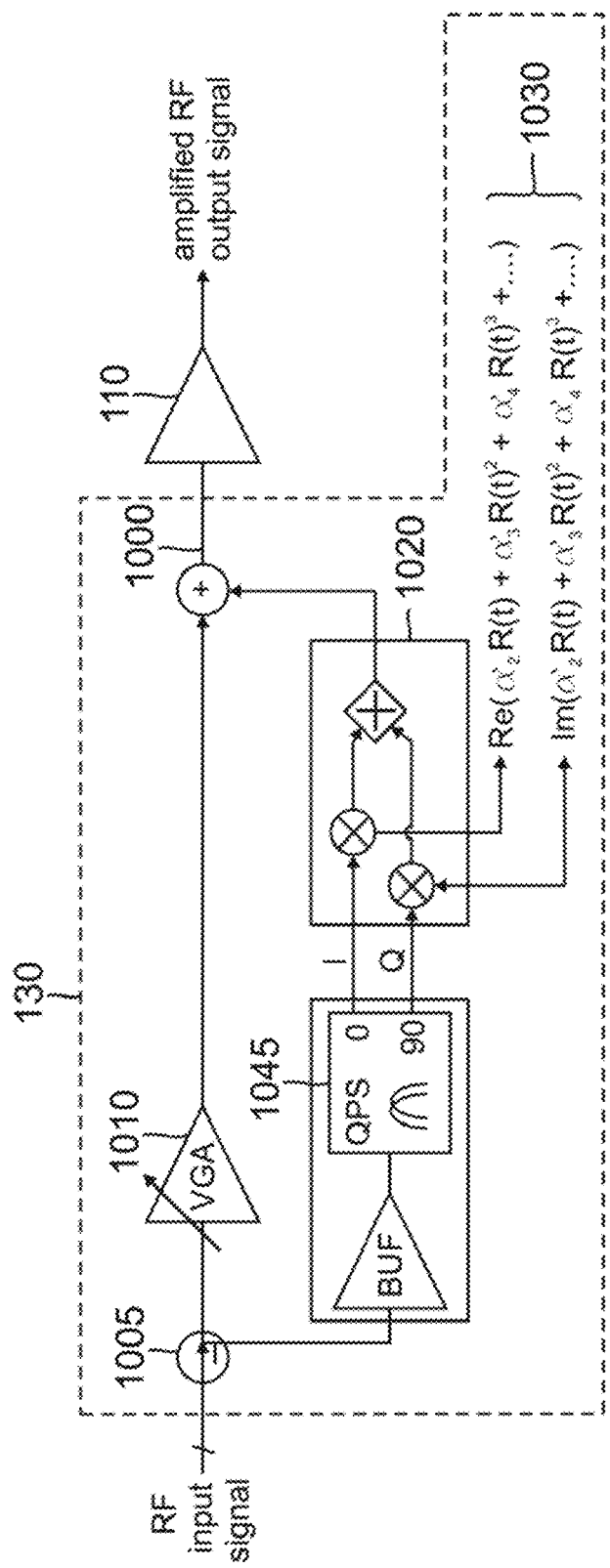
FIG. 10 illustrates an example additive pre-distortion architecture for an RF signal processing circuit in the pre-distorter of FIG. 1.

Additive pre-distortion may be better understood with reference to FIG. 10, which illustrates an example RFSP 130 in greater detail. RFSP 130 provides dramatic improvements in dynamic range through an appropriate decoupling in the production of the linear and non-linear terms in a pre-distorted RF input signal 1000 provided to power amplifier 130. For ease of discussion, it will be assumed that RF input signal 1000 is pre-distorted in the form of the real part of $((\alpha_1 *R(t)+\alpha_2 *R(t)^2+ \ldots )*\exp(j\omega_c t)$ as discussed previously (in other words, no memory compensation is implemented). The linear term in the pre-distorted RF input signal is produced by an appropriate attenuation (or amplification) of the RF input signal in a variable amplifier 1010. Because there is no I/Q channel formation with regard to the linear term, it may be seen that this linear term cannot be phased according to the complex value of the corresponding coefficient $\alpha_1$ (assuming that the SPM, which is not shown for illustration clarity in FIG. 10 determines that $\alpha_1$ should be complex). However, the remaining non-linear terms in the pre-distorted RF input signal may be formed through the use of a buffer and quadrature demodulator circuit 1045 that demodulates a version of the RF input signal (obtained through a coupler 1005) into I and Q portions. The I and Q portions are mixed with a real and imaginary portion 1030 of the polynomial from module 120 (shown in FIG. 9) in an I/Q mixer and combiner circuit 1020. But note that the I portion (real portion) of the polynomial that mixes with the corresponding I portion of the RF input signal and also the Q portion of the polynomial that mixes with the corresponding Q portion of the RF input signal are not necessarily the same as discussed previously with regard to the polynomial $\alpha_1+\alpha_2 *R(t)+\alpha_3 *R(t)^2+\alpha_4 *R(t)^3+ \ldots$ from SPM 105. This is because the I and Q portions of the polynomial may need to be re-phased since the linear portion of the pre-distorted RF input signal has been produced without an I/Q mixing. In other words, the phase relationship between $\alpha_1 *R(t)$ and the remaining non-linear terms in pre-distorted RF input signal 1000 may change because the linear envelope term is no longer re-phased as it would be if it were multiplied by a complex coefficient $\alpha_1$ in an I/Q fashion. To account for this phase relationship loss, the I and Q portions of the pre-distortion signal may be re-phased by the SPM. Thus, the in-phase portion I and the quadrature-phase portion Q of the pre-distortion signal are denoted as the real and imaginary parts of $[\alpha_2'*R(t)^2+\alpha_3'*R(t)^3+\alpha_4'*R(t)^4+ \ldots ]$, respectively, where the alpha coefficients are given a prime signal to signify that these coefficients may differ from those discussed earlier. The additive architecture shown in FIG. 10 has a wider dynamic range and greater signal-to-noise ratio (SNR) as compared to a corresponding RFSP in which the linear term and the non-linear terms in the polynomial(s) from SPM 105 are used to directly multiply the RF input signal. Such a wider dynamic range flows from the fact that the linear term is considerably larger than the remaining terms such that the dynamic range within a non-additive architecture mixer is lost on just the linear term. In contrast, the I and Q signals from demodulator 1045 are mixed to just provide the non-linear terms in the pre-distorted RF input signal. The mixers in circuit 1020 may then be configured to use their full dynamic ranges.

Further descriptions, applications, and methods for error signal formation and RF signal processing may be found in U.S. application Ser. No. 12/257,292 filed Oct. 23, 2008, the contents of which have been previously incorporated by reference herein for all purposes.

Figure 11:
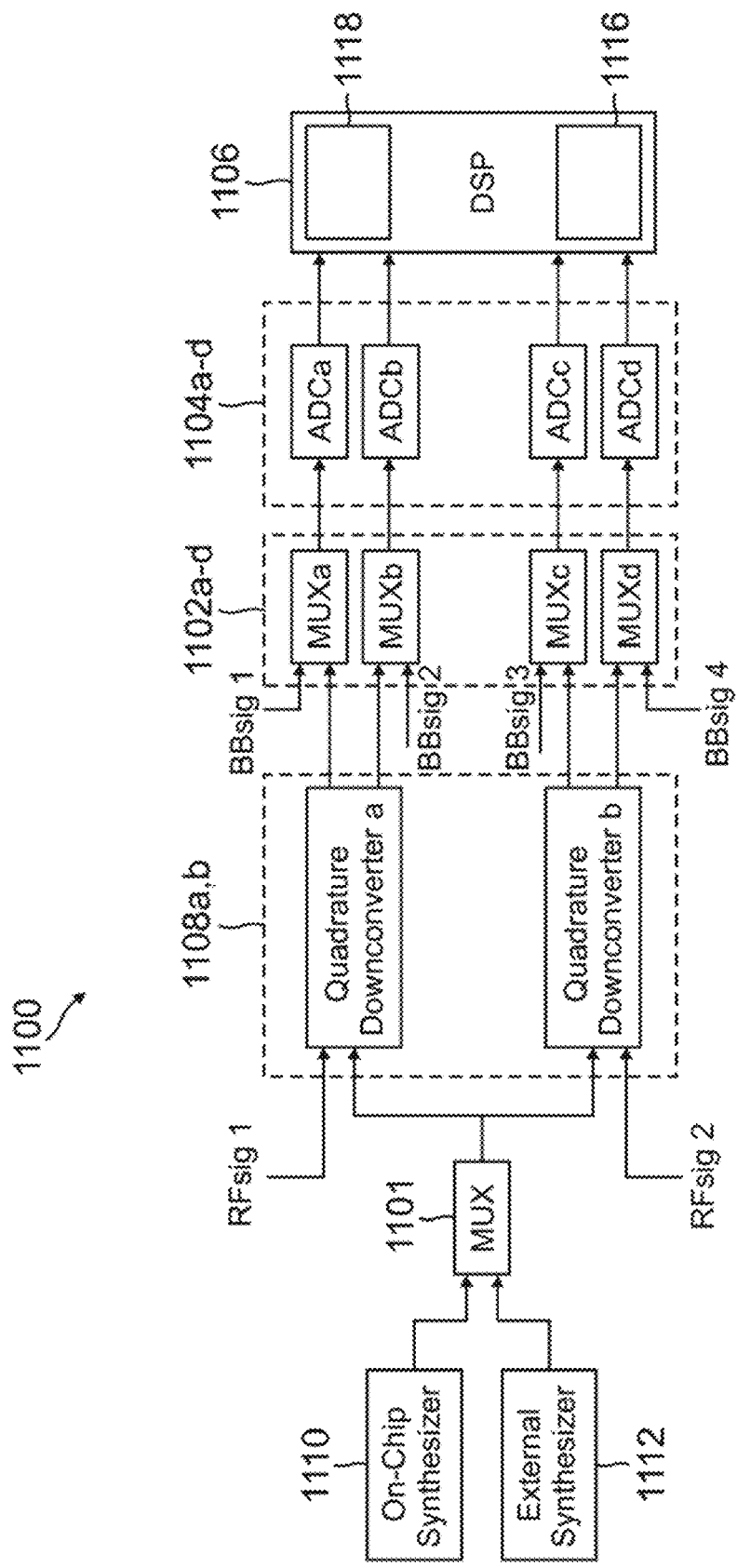
FIG. 11 illustrates a block diagram of an example embodiment of a signal analyzer.

Referring now to FIG. 11, a block diagram is shown of an example embodiment of a signal analyzer 1100, as further described in co-assigned U.S. patent application Ser. No. 12/340,032 filed Dec. 19, 2008, and entitled "Integrated Signal Analyzer for Adaptive Control of Mixed-Signal Integrated Circuits", the contents of which has been previously incorporated by reference herein for all purposes.

Signal analyzer 1100, for example a single-chip integrated signal analyzer, may provide on-chip, real-time monitoring of signal properties such as, for example, dc offsets, power, bandwidth, and power spectrum, and may provide automatic configuration, adjustment, calibration or self-healing of digitally controlled cells. Such integrated signal analyzers may also provide for the extraction of information such as, for example, gain, group delay, and waveform distortion, that involves measuring pairs of signals, such as an RF input signal and an RF feedback signal.

The signal analyzer 1100 may be capable of being combined with or connected to digitally controlled analog devices, for example digitally controlled analog cells or subsystems of primary function circuits. The signal analyzer may be used to compensate for unique performance characteristics and variances of a particular analog device caused, for example, by random transistor mismatches, process-, voltage-, and temperature-dependent performance variations, low voltage headroom, or other factors. The digitally controlled analog devices may be part of a mixed signal integrated circuit or may be an analog cell or subsystem of such an integrated circuit. The signal analyzer and analog subsystem may be used, for example, in low-power, multi-Gigahertz signal processing or other applications. In an example embodiment, the signal analyzer 1100 may be connected to a pre-distortion circuit and a compensation module of a power amplifier suitable for use in a communication system.

In an example embodiment, signal analyzer 1100 may be a RF signal analyzer, and may include one or more multiplexors (MUX) 1101, 1102*a-d*. The MUX may be, for example, digital switches to select one of multiple inputs for output. In one example, multiplexor 1101 is for selecting between one of an on-chip or external synthesized signal as an input to a quadrature downconverter 1108. The multiplexors 1102*a*-1102*d* may select from among baseband signals (BBsig) and corresponding quadrature downconverter signals.

Signal analyzer 1100 may further include one or more analog to digital converters (ADC) 1104*a*-1104*d*. The signal analyzer may also include a digital signal processor (DSP) 1106 for digital Signal processing. In an example embodiment, the DSP may receive four data streams, for example, 12-bit/sample, 100 MegaSamples/s, and may perform various functions, such as timing alignment, I/Q imbalance cancellation, complex gain matching, complex error signal generation, real-time power spectrum estimate, and bias voltage optimization.

In an example embodiment, DSP 1106 may be a digital-circuit subsystem integrated with the digitally-controlled analog subsystem on a mixed-signal system-on-chip. DSP 1106 may be, for example, a microprocessor, programmable logic device, microcontroller, or a dedicated ASIC. To facilitate high-speed real-time signal processing and to shorten the development cycle of the system-on-silicon, an example embodiment of DSP 1106 may include a dedicated DSP ASIC and a separate microcontroller (e.g., microcontroller 1214 in FIG. 12), for example an 8051 microcontroller. The adjustment, calibration, or changes to the operating parameters may require only integer (fixed-point number) and logic calculations, and the microcontroller may make the calculations/determinations from control software (or firmware) on the microcontroller. Computational intensive tasks, for example, evaluation of a floating-point math function, may be implemented in the DSP ASIC block. In principle, the separate microcontroller and the dedicated DSP ASIC may be merged if using a general-purpose digital signal processor (for narrow-band signals) or a single ASIC. DSP 1106 may refer to both a DSP ASIC and a microcontroller, or any other combination of control hardware, software, or firmware that works together to perform the functions of the DSP.

In an example embodiment, a separate microcontroller may provide control signals to DSP 1106 to reprogram or write information to memory 1118 of DSP 1106, such as configuration registers of the DSP. The microcontroller may also read output results form the DSP. In an example embodiment, the DSP 1106 may be specially designed for time-and-frequency resolved "error signal" analysis, and may feature a real-time signal processing architecture using minimum amount of memory. In an example embodiment, "error signal" may refer to the difference between a pair of signals.

In an example embodiment, the signal analyzer may have one or more quadrature downconverters 1108a, 1108b. The quadrature downconverters may be used, for example, to convert an RF input signal to a pair of baseband signals, which may be referred to as in-phase (I) and quadrature (Q) components. In an example embodiment, a local oscillator for the quadrature downconverters may be a PLL-based, on-chip frequency synthesizer 1110 or an external synthesizer 1112. The on-chip synthesizer may be used where an on-chip local oscillator is available. The external synthesizer 1112, on the other hand, may be used for one-time initial calibration during Automatic Test Equipment (ATE) setup and/or testing, or be used in the case where an external local oscillator (LO) is available. Using a power spectrum estimator (PSE) 1116 of the DSP 1106, signal analyzer 1100 may automatically adjust the on-chip synthesizer so that the LO frequency may be aligned with the RF input signals.

Figure 12:
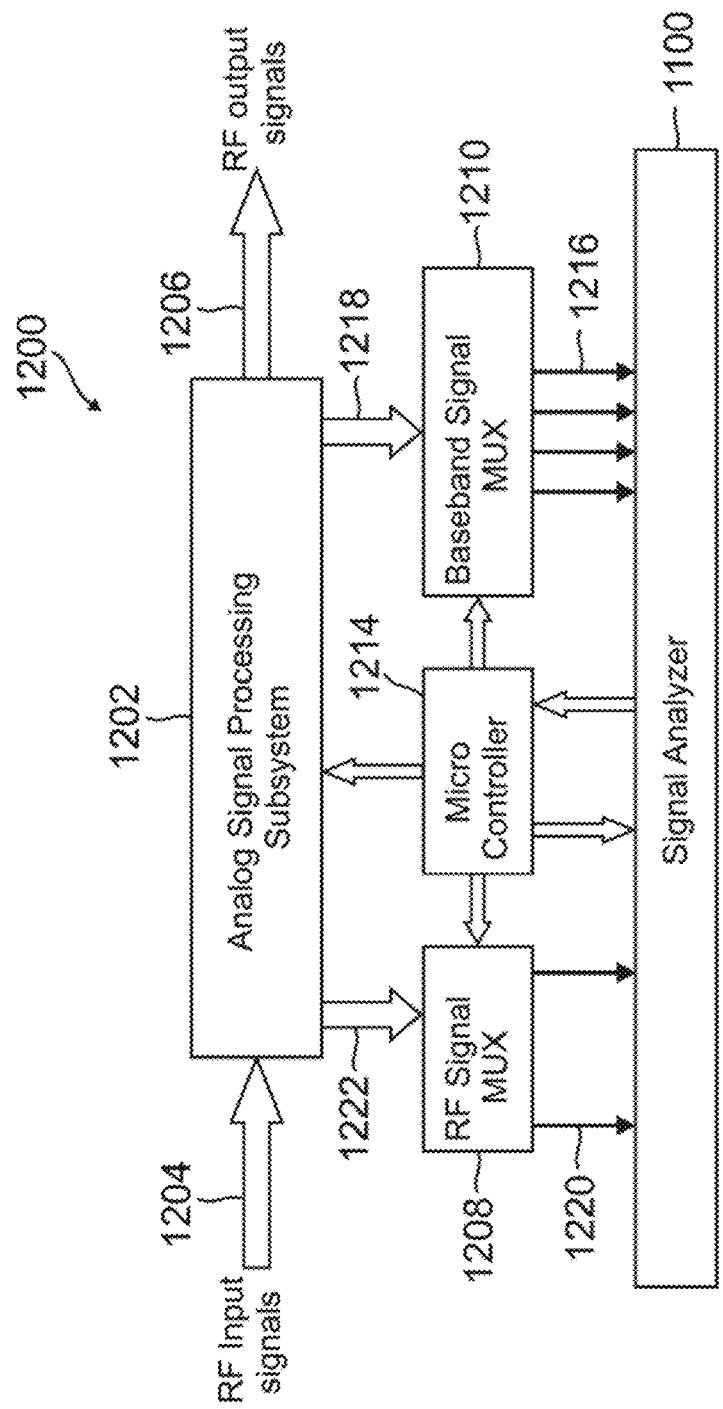
FIG. 12 illustrates a block diagram of an example embodiment of a mixed signal processing system-on chip.

In an example embodiment, signal analyzer 1100 may provide various measuring and analysis functions. For example, the signal analyzer may measure the peak-to-average ratio, a cumulative complementary distribution function (CCDF), the power spectrum, and the out-of-band spectral leakage of an RF signal. The signal analyzer may also analyze the difference between a pair of RF signals, for example the input/output signals of a RF analog subsystem. The signal analyzer 1100 may further extract the power gain, the group delay, and properties of the error signal, such as means-square error, in-band distortion, error spectrum, among other values. For example, a signal analyzer 100 may determine or extract the DC average (offset) of a signal or may be configured as a volt-meter. Functions of the signal analyzer may be controlled by digital information encoded as instructions, for example an embodied software program or firmware of the microcontroller 1214 (FIG. 12).

In an example embodiment, the signal analyzer 1100 may measure a dc offset, power spectrum, and a histogram of a baseband signal (BBsig) (bandwidth<half of the ADC sampling rate). The signal analyzer may also analyze the difference between a pair of baseband signals, for example the input/output signals of a baseband analog subsystem. The signal analyzer may further ext4ract the gain, group delay, an/or mean-square error.

In example embodiments, an analog subsystem with at least one baseband signal may be an analog power waveform detector (RF input, output is the power waveform in baseband), an analog envelop waveform detector (RF input, output is the envelope in baseband), or an analog buffer amplifier and active low-pass filters (baseband input and output). For example, the signal analyzer may be arranged to find the linearity of an active low-pass filter based on operating amplifiers.

In an example embodiment, the signal analyzer may be used for self-healing through self-calibration, configuration, and/or real-time adaptation of digitally-controlled analog subsystems in mixed-signal integrated circuits with RF inputs and/or outputs. Self-healing, adjustments, calibration or other changes, as desired and appropriate, may be made by reprogramming digital controls for the corresponding analog cell. The specific manner in which changes or adjustments may be made ma depend on the particular design of a given application on a case-by-case basis. For example, the signal analyzer may provide a performance metric, and the microcontroller may perturb the control parameters of the analog subsystem so as to optimize the performance metric using a stochastic approximation algorithm in the firmware. Persons of skill in the art designing a specific application to perform a desired function may know and appreciate how changes should be made in a specific circumstance, application, or embodiment.

Referring now to FIG. 12, a block diagram of an example embodiment of a mixed signal processing system-on-chip 1200 is shown. Mixed signal processing system-on-chip 1200 may include, for example, an analog signal processing subsystem 1202. The analog signal processing subsystem may be, for example, a pre-distortion circuit and a compensation circuit for a power amplifier suitable for use in a communication system. The subsystem 1202 may have a number of RF input signals 1204 and a number of RF output signals 1206.

On-chip microcontroller 1214 may select a number of input signals 204 and output signals 206 to be analyzed. A baseband signal multiplexor or multiplexors (MUX) 1210 may select a number of baseband analog signals 1216 from a group of analog baseband signals 1218, for example, four out of a group of baseband analog signals as illustrated in FIG. 12. The RF signal multiplexor or multiplexors (MUX) 1208 may select a number of RF analog signals 1220 from a group of RF analog signals 1222, for example, two RF signals. In an example embodiment, DSP 106 (FIG. 11) may make various measurements, extract various information, and/or adjust operating parameters responsive to comparisons among the various selected RF and/or baseband signals. The adjustment, calibration, or changes to the operating parameters responsive to the signals provided to the DSP may provide for self-healing, self-calibration, or real-time adjustment to correct for non-idealities in the operation of the analog circuit caused by various non-ideal conditions.

In some example embodiments for particular applications, analyzing a pair of RF signals may be all that is desired. In such embodiments, an RF signal MUX 1208 may not be needed. The on-chip microcontroller 1214 may select the RF or baseband signals from the analog signal processing subsystems, measure the signal properties in real time from the signal analyzer, and adjust the configuration of digitally controlled analog subsystems as appropriate or desired for a particular application.

Further descriptions, application circuits, and methods involving the signal analyzer may be found in U.S. application Ser. No. 12/340,032 filed Dec. 19, 2008, the contents of which have been previously incorporated by reference.

Figure 13:
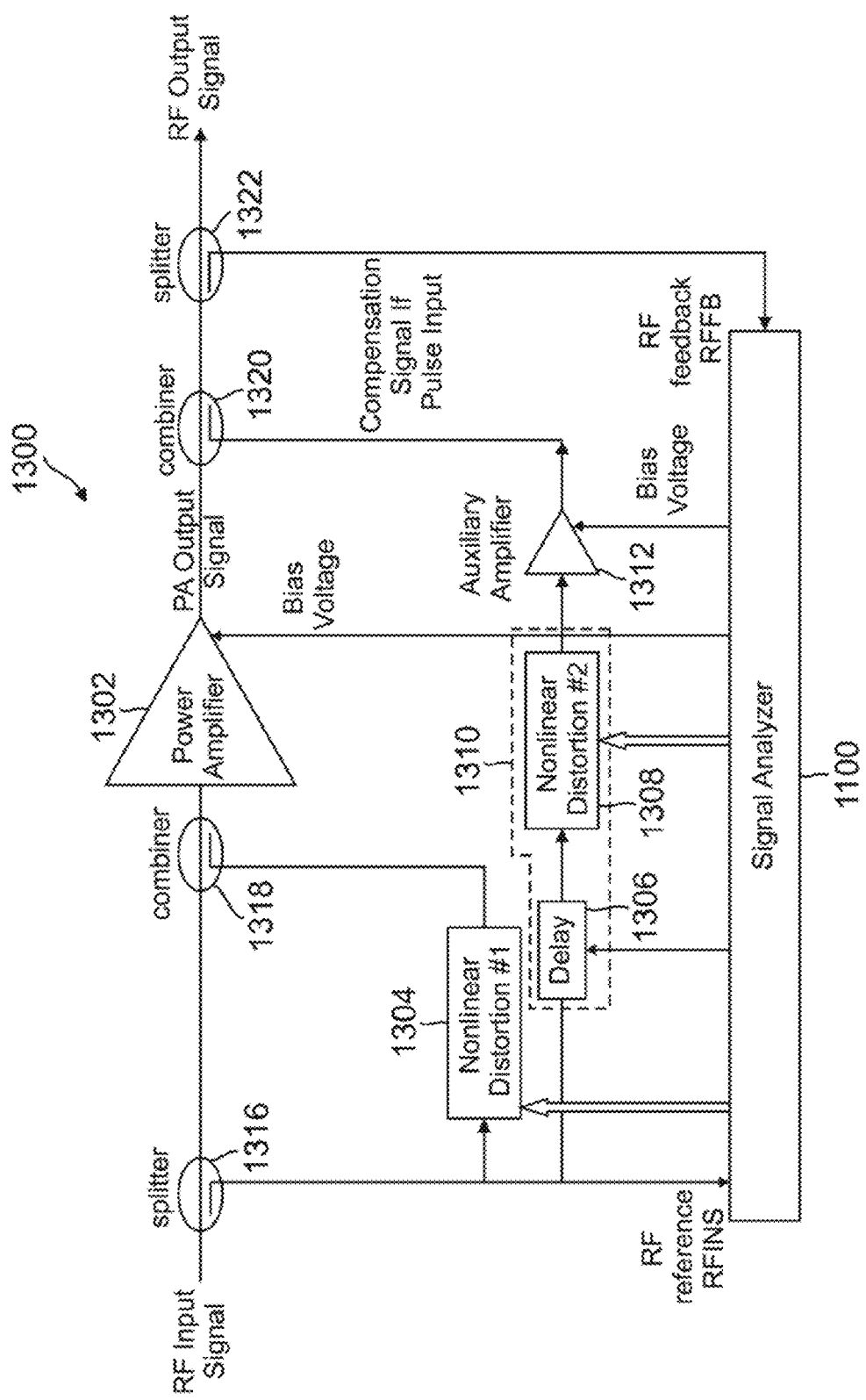
FIG. 13 illustrates a block diagram of an example embodiment of a mixed-signal processing circuit using an integrated signal analyzer.

Referring now to FIG. 13, a block diagram of an example embodiment of a mixed-signal processing system 1300 using an integrated signal analyzer 1100 is illustrated. In one embodiment, system 1300 is a self-adaptive power amplifier using both pre-distortion and post-cancellation. System 1300 includes a pre-distortion circuit 1304, a delay circuit or filter 1306, an optional pre-distortion circuit 1308, and an auxiliary amplifier 1312 to be used with a power amplifier 1302. In one embodiment, pre-distortion circuit 1304, delay circuit or filter 1306 with optional pre-distortion circuit 1308, and signal analyzer 1100 form an analog signal processing subsystem. The pre-distortion subsystem including pre-distortion circuit 1304 is a digitally-controlled analog signal processing circuit that can be integrated with the signal analyzer on a single chip in one embodiment. Delay circuit or filter 1306 and optional pre-distortion circuit 1308 form a compensation module 1310 which is operably coupled to auxiliary amplifier 1312 to selectively provide a compensation signal to the power amplifier output. The auxiliary amplifier may operate continuously or operate in burst mode. In the burst-mode operation, the auxiliary amplifier has non-zero output only when a burst pulse is detected. As noted above, pre-distortion circuit 1308 is optional:

An RF input signal is split by splitter 1316 with at least a portion of the input signal being sent to pre-distortion circuit 1304, compensation module 1310 (or delay filter 1306), and signal analyzer 1100. A portion of the RF input signal is combined with a pre-distortion signal from pre-distortion circuit 1304 at combiner 1318 to provide a pre-distorted input signal to power amplifier 1302, which then outputs an amplified RF signal (PA output signal). A compensation signal from auxiliary amplifier 1312 and compensation module 1310 may then be combined with the amplified RF signal via combiner 1320. The RF combiner 1320 may include a quarter-wave transmission line in one example. A splitter 1322 then splits the potentially compensated output signal to provide an RF output signal and an RF feedback signal to signal analyzer 1100.

Signal analyzer 1100 analyzes the RF input signal (RF reference) and the RF feedback signal (and possibly other RF or baseband signals from the analog signal processing subsystems) to measure the signal properties in real time and to adjust the configuration of digitally controlled analog subsystems as appropriate or desired for a particular application. As noted above, signal analyzer 1100 can provide real-time monitoring of signal properties such as, for example, peak-to-average ratio, dc offsets, power, bandwidth, and power spectrum, and may provide automatic configuration, adjustment, calibration or self-healing of digitally controlled cells. The analyzer may also provide for the extraction of information such as, for example, gain, group delay, and waveform distortion.

In one embodiment, signal analyzer 1100 provides a first digital control signal to pre-distortion circuit 1304 to provide a pre-distorted signal to power amplifier 1302, and a second digital control signal to optional pre-distortion circuit 1308 to provide a compensation signal to auxiliary amplifier 1312. Advantageously, the first and second digital control signals are provided to optimize the pre-distortion and post-cancellation adjustments substantially in real time. In one example, the first digital control signal includes a group of coefficients adaptively varying with time to adjust the pre-distortion circuit. In another example, the second digital control signal includes a group of coefficients to adjust the post-cancellation circuit.

Signal analyzer 1100 further provides a time delay signal to delay filter 1306 and may provide optimizing bias voltage signals to power amplifier 1302 and auxiliary amplifier 1312 in other embodiments. The delay circuit is operable to delay the RF input signal and the post-cancellation circuit is operable to receive the delayed RF input signal and to provide the compensation signal to the auxiliary amplifier. In one embodiment, the signal analyzer further includes a digital controller to provide the first and second digital control signals, wherein the digital controller comprises one of a microprocessor and a digital signal processor in one example. Furthermore, signal analyzer 1100 may adaptively adjust various other amplifier parameters of the main and auxiliary amplifiers.

As noted above and discussed in more detail below, the auxiliary amplifier 1312 may be specially designed for the amplification of bursty pulses (see FIGS. 15a and 15b which illustrate the input and output waveforms of the auxiliary amplifier, respectively). In the presence of pre-distortion, the post-cancellation signal is non-zero only when the PA output signal is clipped by hard saturation (e.g., RF signals having a large peak-to-average ratio). The burst-mode operation of auxiliary amplifier 1312 fundamentally improves the power efficiency of the error amplifier, which traditionally has required continuous operation in feedforward linearization. Because the error amplifier needs high gain (e.g., 40 dB) and high peak power, reducing the power consumption of the error amplifier is important for the final power efficiency of the system. Furthermore, in traditional feedforward linearization, the error amplifier is a Class-AB amplifier. In one embodiment, auxiliary amplifier 1312 is a Class-C amplifier, although other amplifiers are applicable, and only amplifies the peaks clipped by hard-saturation of power amplifier 1302.

Figure 14:
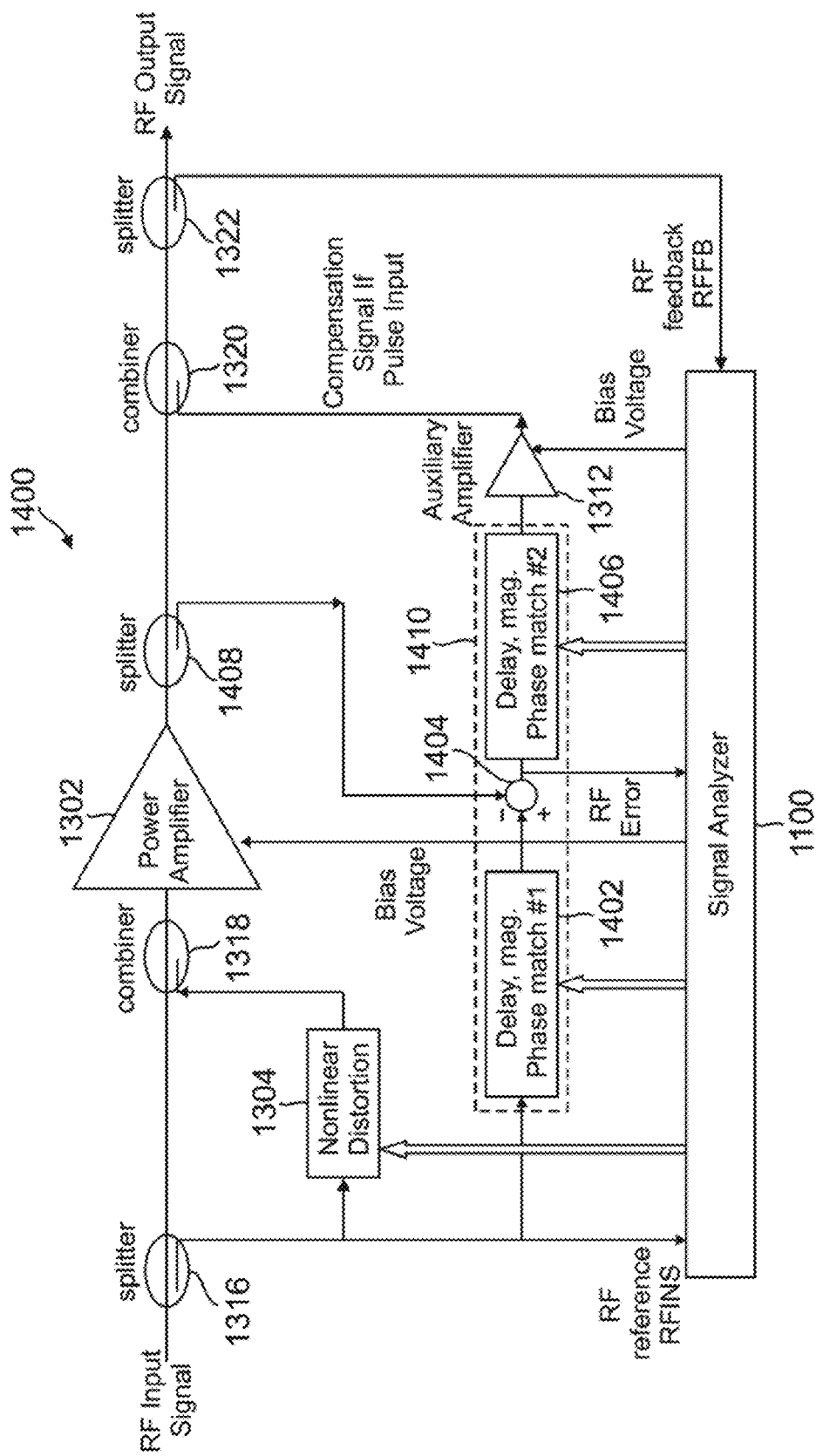
FIG. 14 illustrates a block diagram of another example embodiment of a mixed-signal processing circuit using an integrated signal analyzer.

FIG. 14 illustrates a block diagram of another example embodiment of a mixed-signal processing system 1400 using an integrated signal analyzer 1100. Similar components as described above with respect to FIG. 13 are denoted with the same reference numbers and further description of similar component parts may be omitted to reduce redundancy although all descriptions and functionality of the similar components are applicable here with respect to FIG. 14.

Referring now to FIG. 14, another compensation module 1410 is provided as an analog signal processing subsystem and in one embodiment, system 1400 is a self-adaptive power amplifier using both pre-distortion and feedforward compensation. As noted above, the pre-distortion subsystem including pre-distortion circuit 1304 is a digitally-controlled analog signal processing circuit that can be integrated with the signal analyzer on a single chip. In this embodiment, compensation module 1410 includes two delay, magnitude, phase (DMP) matching circuits 1402 and 1406 with an adder 1404 therebetween. System 1400 further includes a splitter 1408 which splits the power amplifier output signal and at least a portion of the signal is sent to adder 1404.

The feedforward compensation requires accurate group delay, magnitude, and phase matching to generate an RF control signal. The signal analyzer monitors the original input (RF reference) and the final output (RF feedback) signals in real-time, and acts as a performance monitor for adaptive adjustment of the pre-distortion circuit 1304 and the DMP matching circuits 1402 and 1406 in compensation module 1410. An RF error signal may also be sent to signal analyzer 1100 after adder 1404. In one embodiment, DMP matching circuit 1402 can be controlled by minimizing the RF error power and DMP matching circuit 1406 can be controlled by minimizing the out-of-band emission of the RF feedback signal (e.g., by performing a cost-function for adaptive adjustment).

In one embodiment, signal analyzer 1100 provides a first digital control signal to pre-distortion circuit 1304 to provide a pre-distorted signal to power amplifier 1302, and a second digital control signal to compensation module 1410 to provide a compensation signal to the main power amplifier output via auxiliary amplifier 1312. In one example, the first digital control signal includes a group of coefficients adaptively varying with time to adjust the pre-distortion circuit. In another example, the second digital control signal includes a delay, magnitude, and phase matching signal.

In one embodiment, the signal analyzer further includes a digital controller to provide the first and second digital control signals, wherein the digital controller comprises one of a microprocessor and a digital signal processor in one example. Furthermore, signal analyzer 1100 may adaptively adjust various other amplifier parameters of the main and auxiliary amplifiers.

As noted above with FIG. 13, the auxiliary amplifier 1312 may operate in either continuous-mode or burst-mode. In one embodiment of the invention, the auxiliary amplifier is designed for the amplification of bursty pulses (see FIGS. 15a and 15b which illustrate the input and output waveforms of the auxiliary amplifier, respectively). In the presence of pre-distortion, the post-cancellation signal is non-zero only when the PA output signal is clipped by hard saturation (e.g., RF signals having a large peak-to-average ratio). The burst-mode operation of the auxiliary amplifier fundamentally improves the power efficiency of the error amplifier, which traditionally has required continuous operation in feedforward linearization. Because the error amplifier needs high gain (e.g., 40 dB) and high peak power, reducing the power consumption of the error amplifier is important for the final power efficiency of the system. Furthermore, in traditional feedforward linearization, the error amplifier is a Class-AB amplifier. In one embodiment, auxiliary amplifier 1312 may be a Class-C amplifier although other amplifiers are possible.

Figure 15A:
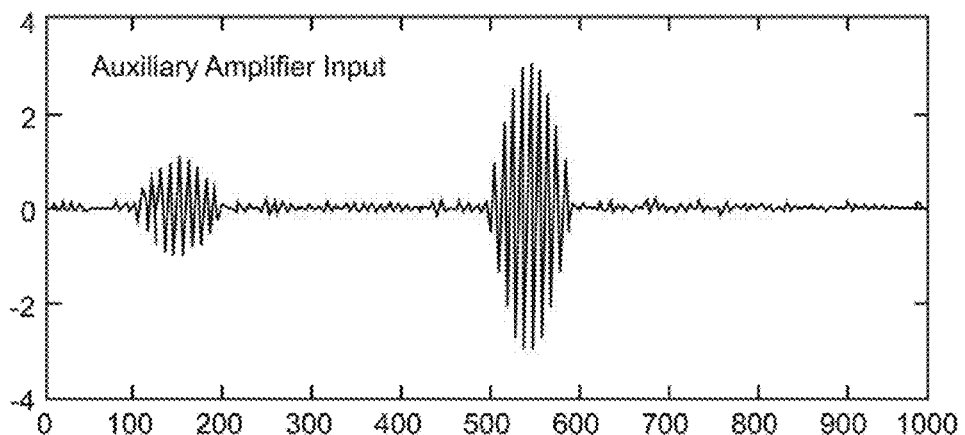
FIGS. 15a and 15b illustrate burst pulse input and output signals to and from an auxiliary amplifier, respectively.
Figure 15B:
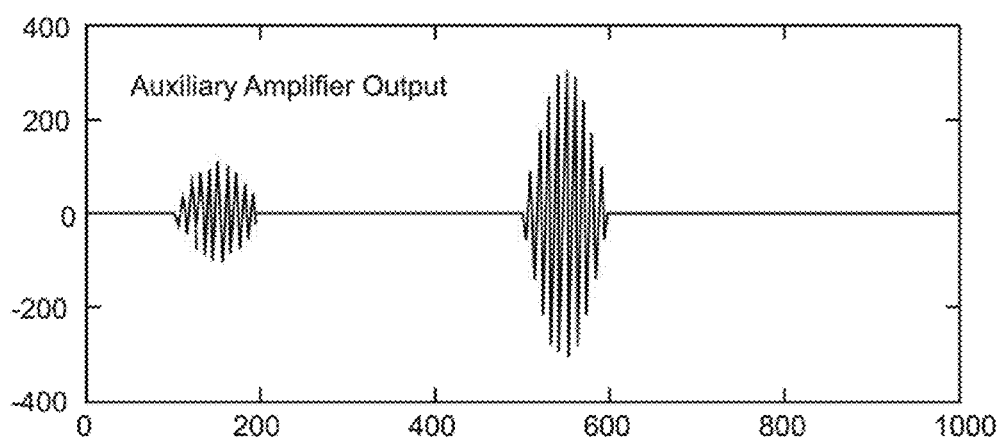

FIGS. 15a and 15b illustrate burst pulse input and output signals to and from an auxiliary amplifier, respectively, which activate the auxiliary amplifier in one embodiment.

Advantageously, the present disclosure provides mixed-signal adaptive integrated circuits and methods for adaptive control of such circuits. A combination of an RF pre-distortion circuit and a compensation module including post-cancellation or feedforward compensation is utilized. A signal analyzer allows for adaptive control of the RF pre-distortion circuit and the compensation module in real-time, and in one embodiment includes a single-chip integrated performance monitor. No pilot tones are required, and a burst-mode operation of an auxiliary amplifier significantly reduces power consumption.

Although embodiments of the invention has been shown and clearly depicted, various other changes, additions and omissions in the form and detail thereof may be made therein without departing from the intent and scope of this invention. The appended claims encompass all such changes and modifications as fall within the true spirit and scope of this invention.

What is claimed is:

1. A mixed-signal adaptive integrated circuit receiving an RF input signal and coupled to a power amplifier, comprising:

a first pre-distortion circuit operable to receive the RF input signal and to add a first pre-distortion signal to the RF input signal to thereby provide a first pre-distorted RF input signal which is provided to the power amplifier to provide the amplified RF output signal;

a compensation module operable to receive the RF input signal and to provide a compensation signal, wherein the compensation module is coupled to an auxiliary amplifier which receives the compensation signal and is operable to amplify the compensation signal, to selectively add the amplified compensation signal to the amplified RF output signal when a burst pulse appears in the amplified RF output signal, and to provide a compensated output signal; and a signal analyzer operable to process the RF input signal and the compensated output signal to generate, based on an error signal derived from digitally delay-matching the RF input signal and the compensated output signal, a first digital control signal for the first pre-distortion circuit, and a second digital control signal for the compensation module, wherein the first digital control signal provides a group of coefficients for a polynomial function of an envelope of the RF input signal.

2. The circuit of claim 1, wherein the group of coefficients of the first digital control signal adaptively vary with time to adjust the first pre-distortion circuit.

3. The circuit of claim 1, wherein the second digital control signal includes a time delay control signal.

4. The circuit of claim 1, wherein the second digital control signal includes a group of coefficients to adjust a post-cancellation circuit.

5. The circuit of claim 1, wherein the second digital control signal includes a delay, magnitude, and phase matching signal.

6. The circuit of claim 1, wherein the compensation module includes a delay circuit operable to delay the RF input signal and a post-cancellation circuit operable to receive the delayed RF input signal and to provide the compensation signal to the auxiliary amplifier.

7. The circuit of claim 1, wherein the compensation module includes a delay, magnitude, and phase matching circuit controlled by minimizing RF error power.

8. The circuit of claim 1, wherein the compensation module includes a delay, magnitude, and phase matching circuit controlled by minimizing an out-of-band emission of the RF feedback signal.

9. The circuit of claim 1, wherein the signal analyzer includes a digital controller to provide the first and second digital control signals.

10. The circuit of claim 9, wherein the digital controller comprises one of a microprocessor and a digital signal processor.

11. The circuit of claim 1 wherein the auxiliary amplifier is operable not to receive the first pre-distortion signal and not to receive the first pre-distorted RF input signal.

12. The circuit of claim 11 wherein the compensation module comprises a second pre-distortion circuit operable to effect pre-distortion in the compensation signal for the auxiliary amplifier.

13. The circuit of claim 1 wherein the compensation module comprises a second pre-distortion circuit operable to effect pre-distortion in the compensation signal for the auxiliary amplifier.

14. The circuit of claim 1 wherein the compensation signal is a version of the RF input signal and is amplified by the auxiliary amplifier.

15. A method for adaptive control of a mixed-signal integrated circuit, the mixed-signal integrated circuit receiving an RF input signal and coupled to a power amplifier, the method comprising:
    receiving the RF input signal at a first pre-distortion circuit;
    adding a first pre-distortion signal to the RF input signal to provide a first pre-distorted RF input signal to the power amplifier;
    generating an amplified RF output signal from the power amplifier;
    receiving the RF input signal into a compensation module to provide a compensation signal;
    receiving the compensation signal into an auxiliary amplifier to provide an amplified compensation signal when a burst pulse appears in the amplified RF output signal;
    selectively adding the amplified compensation signal to the amplified RF output signal to provide a compensated output signal; and
    analyzing the RF input signal and the compensated output signal to generate, based on an error signal derived from digitally delay-matching the RF input signal and the compensated output signal, a first digital control signal for providing the first pre-distortion signal and a second digital control signal for providing the compensation signal, wherein the first digital control signal provides a group of coefficients for a polynomial function of an envelope of the RF input signal.

16. The method of claim 15, further comprising extracting information from analyzing the RF input signal and the compensated output signal, the information including gain, group delay, and waveform distortion.

17. The method of claim 15, further comprising generating an optimized bias voltage signal for one of the power amplifier and the auxiliary amplifier from analyzing the RF input signal and the compensated output signal.

18. The method of claim 15, wherein the first digital control signal controls the first pre-distortion circuit.

19. The method of claim 15, wherein the second digital control signal includes a time delay signal.

20. The method of claim 15, wherein the second digital control signal includes a group of coefficients that controls the post-cancellation circuit.

21. The method of claim 15, wherein the second digital control signal includes a delay, magnitude, and phase matching signal.

22. The method of claim 15 wherein the auxiliary amplifier does not receive the first pre-distortion signal and does not receive the first pre-distorted RF input signal.

23. The method of claim 22 wherein the compensation module comprises a second pre-distortion circuit which effects pre-distortion in the compensation signal for the auxiliary amplifier.

24. The method of claim 15 wherein the compensation module comprises a second pre-distortion circuit which effects pre-distortion in the compensation signal for the auxiliary amplifier.

25. The method of claim 15 wherein the compensation signal is a version of the RF input signal and is amplified by the auxiliary amplifier.

26. An amplifier circuit operable to amplify an RF input signal and to provide an output signal comprising an amplified version of the RF input signal, the amplifier circuit comprising:
    a first module operable to amplify the RF input signal and to provide a first output signal comprising a first amplified version of the RF input signal, the first module comprising:
        a first pre-distortion subsystem operable to receive the RF input signal and to provide a first pre-distorted RF input signal according to a group of coefficients for a polynomial function of an envelope of the RF input signal; and
        a first amplifier coupled to the first pre-distortion subsystem and operable to receive and amplify the first pre-distorted RF input signal and to provide the first output signal;
    a post-cancellation module coupled to an auxiliary amplifier, wherein (a) the post-cancellation module is operable to receive the RF input signal and to provide a second output signal which is combined with the first output signal to provide the output signal of the amplifier circuit, and (b) the second output signal either comprises, when the first output signal is clipped by saturation of the first amplifier, a second amplified version of the RF input signal generated by the auxiliary amplifier or is a predefined value; and
    a signal analyzer operable to process the RF input signal and the output signal of the amplifier circuit to generate, based on an error signal derived from digitally delay-matching the RF input signal and the compensated output signal, one or more control signals for the first module and the post-cancellation module.

27. The circuit of claim 26, wherein the control signals comprise signals representing values of the group of coefficients and wherein the values of the group of coefficients adaptively vary.

28. The circuit of claim 26 wherein the post-cancellation module comprises a second pre-distortion subsystem operable to receive the RF input signal and to provide a second pre-distorted RF input signal for pre-distorting the second amplified version of the RF input signal.

29. An amplification method performed by an amplifier circuit for amplifying an RF input signal and providing an output signal comprising an amplified version of the RF input signal, the amplification method comprising:
    in a first module amplifying the RF input signal and providing a first output signal comprising a first amplified version of the RF input signal, the amplifying by the first module comprising:
        a first pre-distortion subsystem receiving the RF input signal and providing a first pre-distorted RF input signal according to a group of coefficients for a polynomial function of an envelope of the RF input signal; and
        a first amplifier coupled to the first pre-distortion subsystem and receiving and amplifying the first pre-distorted RF input signal and providing the first output signal;
    in a post-cancellation module receiving the RF input signal and providing a second output signal which is combined with the first output signal to provide the output signal of the amplifier circuit, wherein the second output signal either comprises, when the first output signal is clipped by saturation of the first amplifier, a second amplified version of the RF input signal generated by an auxiliary amplifier or is a predefined value; and
    in a signal analyzer, processing the RF input signal and the output signal of the amplifier circuit to generate, based on an error signal derived from digitally delay matching the RF input signal and the compensated output signal, one or more control signals for the first module and the post-cancellation module.

30. The method of claim 29 wherein the post-cancellation module comprises a second pre-distortion subsystem receiving the RF input signal and providing a second pre-distorted RF input signal for pre-distorting the second amplified version of the RF input signal.

31. The method of claim 29, wherein the control signals comprise signals representing values of the group of coefficients and wherein the values of the group of coefficients adaptively vary.

\* \* \* \* \*

UNITED STATES PATENT AND TRADEMARK OFFICE
CERTIFICATE OF CORRECTION

PATENT NO. : 8,706,062 B1
APPLICATION NO. : 12/421324
DATED : April 22, 2014
INVENTOR(S) : Qian Yu et al.

It is certified that error appears in the above-identified patent and that said Letters Patent is hereby corrected as shown below:

In the Specification:

| | |
|---|---|
| Column 6, Line 58 | Delete "as" and insert --$\alpha_1$-- |
| Column 9, Line 40 | Delete "asynchrdnicity" and insert --asynchronicity-- |
| Column 11, Line 31 | Delete "etTects," and insert --effects,-- |
| Column 12, Line 8 | After "delay", insert --filter-- |
| Column 12, Line 32 | Delete "100" and insert --130-- |
| Column 13, Line 23 | Delete "130" and insert --110-- |
| Column 15, Line 62 | Delete "100" and insert --1100-- |

Signed and Sealed this
Seventh Day of October, 2014

Michelle K. Lee
*Deputy Director of the United States Patent and Trademark Office*